(12) United States Patent
Onuki et al.

(10) Patent No.: US 10,304,894 B2
(45) Date of Patent: May 28, 2019

(54) IMAGING SENSOR, IMAGING SYSTEM, AND MOVING BODY

(71) Applicant: CANON KABUSHIKI KAISHA, Tokyo (JP)

(72) Inventors: Yusuke Onuki, Fujisawa (JP); Masahiro Kobayashi, Tokyo (JP); Kazunari Kawabata, Mitaka (JP); Hiroshi Sekine, Kawagoe (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 74 days.

(21) Appl. No.: 15/608,746

(22) Filed: May 30, 2017

(65) Prior Publication Data

US 2017/0352697 A1  Dec. 7, 2017

(30) Foreign Application Priority Data

Jun. 6, 2016  (JP) .................. 2016-112840

(51) Int. Cl.
*H04N 5/335* (2011.01)
*H01L 27/146* (2006.01)
*H04N 5/355* (2011.01)
*H04N 5/369* (2011.01)

(52) U.S. Cl.
CPC .. *H01L 27/14643* (2013.01); *H01L 27/14609* (2013.01); *H01L 27/14683* (2013.01); *H01L 27/14689* (2013.01); *H04N 5/335* (2013.01); *H04N 5/355* (2013.01); *H04N 5/369* (2013.01)

(58) Field of Classification Search
CPC ......... H01L 27/14643; H01L 27/14609; H01L 27/14683; H01L 27/14689; H04N 5/335; H04N 5/369
USPC ....................................................... 359/689
See application file for complete search history.

(56) References Cited

U.S. PATENT DOCUMENTS 8,759,737 B2 *  6/2014  Egawa ................... H04N 5/378
250/208.1

FOREIGN PATENT DOCUMENTS

| JP | 2006-246450 A | 9/2006 |
| JP | 2014-165399 A | 9/2014 |
| JP | 2016-111641 A | 6/2016 |

* cited by examiner

*Primary Examiner* — James R Greece
(74) *Attorney, Agent, or Firm* — Canon U.S.A., Inc. IP Division

(57) ABSTRACT

Respective first signal holding units of a plurality of sets are commonly connected to an input node of an amplification unit of one set via a second transfer unit of a set to which the first signal holding unit corresponds, and respective second signal holding units of the plurality of sets are commonly connected to the input node of the amplification unit of one set via a fourth transfer unit of a set to which the second signal holding unit corresponds.

20 Claims, 13 Drawing Sheets

IMAGING SENSOR, IMAGING SYSTEM, AND MOVING BODY

BACKGROUND OF THE INVENTION

Field of the Invention

The aspect of the embodiments relates to an imaging sensor and an imaging system.

Description of the Related Art

An imaging sensor provided with a plurality of unit cells arranged in a plurality of rows and a plurality of columns has been proposed.

An imaging sensor that performs a global electronic shutter in which exposure start and exposure end are controlled by an electronic shutter in a plurality of unit cells at the same time has also been proposed.

An imaging sensor described in Japanese Patent Laid-Open No. 2006-246450 has the following configuration. In the imaging sensor that performs the global electronic shutter, a pixel is provided with a photoelectric conversion unit, a floating diffusion capacitance to which a signal generated by the photoelectric conversion unit is transferred, and a plurality of signal holding units.

In the imaging sensor according to Japanese Patent Laid-Open No. 2006-246450, an electric path between one of the plurality of signal holding units and the photoelectric conversion unit is set to have a high impedance, and an electric path between the other one of the plurality of signal holding units and the photoelectric conversion unit is set to have a low impedance. As a result, a low sensitivity signal is held in the signal holding unit having the high impedance, and a high sensitivity signal is held in the signal holding unit having the low impedance. In the imaging sensor according to Japanese Patent Laid-Open No. 2006-246450, one amplification unit is provided so as to correspond to each of the plurality of signal holding units.

SUMMARY OF THE INVENTION

The aspect of the embodiments relates to an imaging sensor including: a plurality of sets, each set including a photoelectric conversion unit, a first signal holding unit, an amplification unit provided with an input node, a first transfer unit provided in an electric path between the photoelectric conversion unit and the first signal holding unit, a second transfer unit, a second signal holding unit, a third transfer unit provided in an electric path between the photoelectric conversion unit and the second signal holding unit, and a fourth transfer unit; and a control unit configured to control the plurality of sets, in which the control unit sets starting and ending of transfer of a signal by the first transfer unit from the photoelectric conversion unit to the first signal holding unit to be respectively performed at a same time in the plurality of sets, the photoelectric conversion unit accumulates signals respectively in a first accumulation period and a second accumulation period, the respective first transfer units of the plurality of sets transfer the signals corresponding to the first accumulation period from the photoelectric conversion unit to the first signal holding unit, the respective third transfer units of the plurality of sets transfer the signals corresponding to the second accumulation period from the photoelectric conversion unit to the second signal holding unit, the respective first signal holding units of the plurality of sets are commonly connected to the input node of one set via the second transfer unit of the set to which the first signal holding unit corresponds, the respective second signal holding units of the plurality of sets are commonly connected to the input node of one set via the fourth transfer unit of the set to which the second signal holding unit corresponds.

Further features of the disclosure will become apparent from the following description of exemplary embodiments with reference to the attached drawings.

DESCRIPTION OF THE EMBODIMENTS

The following technology is to discuss a connection method in a configuration provided with a plurality of signal holding units corresponding to a single photoelectric conversion unit. That is, descriptions will be given of the connection method of connecting the plurality of signal holding units to an amplification unit that outputs a signal corresponding to signals held by the plurality of signal holding units to the outside of a pixel.

Hereinafter, respective exemplary embodiments will be described with reference to the drawings.

In the following explanation, an example in which a noise component is included in a signal will be described in some cases. This noise component included in the signal may be represented as an N component in the following explanation. In addition, a component obtained by subtracting the N component from the signal may be represented as an S component.

First Exemplary Embodiment

Configuration of an Imaging Sensor

Figure 1:
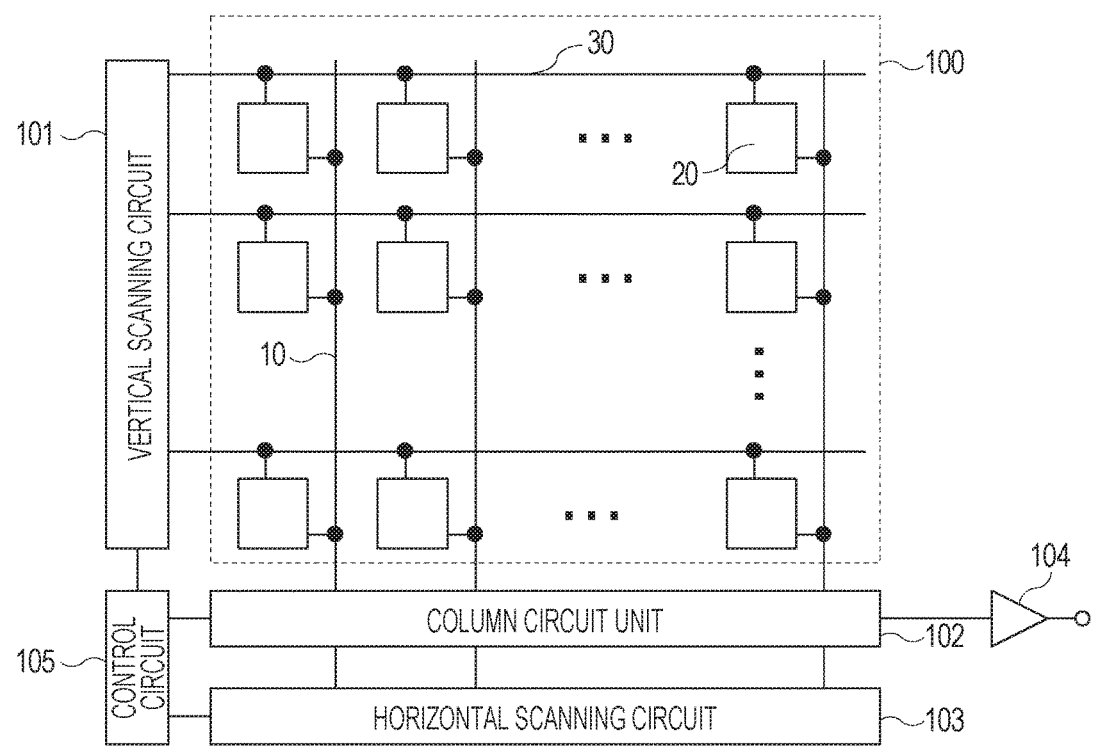
FIG. 1 illustrates a configuration of an imaging sensor.

FIG. 1 illustrates an imaging sensor according to the present exemplary embodiment. The imaging sensor according to the present exemplary embodiment includes column signal lines 10 and unit cells 20. The unit cells 20 are arranged in a plurality of rows and a plurality of columns in a cell array 100. The column signal line 10 is arranged so as to correspond to the column where the unit cells 20 are arranged. The imaging sensor also includes a vertical scanning circuit 101. The unit cells 20 and the vertical scanning circuit 101 are connected to each other via a control line 30 in units of row such that a common signal is supplied to the unit cells 20 in one row from the vertical scanning circuit 101. The vertical scanning circuit 101 is a control unit configured to control an accumulation period of the unit cell 20.

The imaging sensor also includes a column circuit unit 102, a horizontal scanning circuit 103, and an output circuit 104. The column circuit unit 102 is provided with a plurality of column circuits. Each of the plurality of column circuits is arranged so as to correspond to one of the plurality of column signal lines 10. Each of the plurality of column circuits outputs a signal obtained by amplifying the signal output to the column signal line 10 to the output circuit 104.

The horizontal scanning circuit 103 sequentially selects the plurality of column circuits included in the column circuit unit 102. As a result, the signal held by each of the plurality of column circuits is sequentially output to the output circuit 104. The output circuit 104 outputs a signal to the outside of the imaging sensor. The signal output by the output circuit 104 is a signal output by the imaging sensor.

The imaging sensor further includes a control circuit 105. The control circuit 105 is connected to each of the vertical scanning circuit 101, the column circuit unit 102, and the horizontal scanning circuit 103 via a driving line for supplying a driving signal.

Configuration of the Unit Cell

Figure 2:
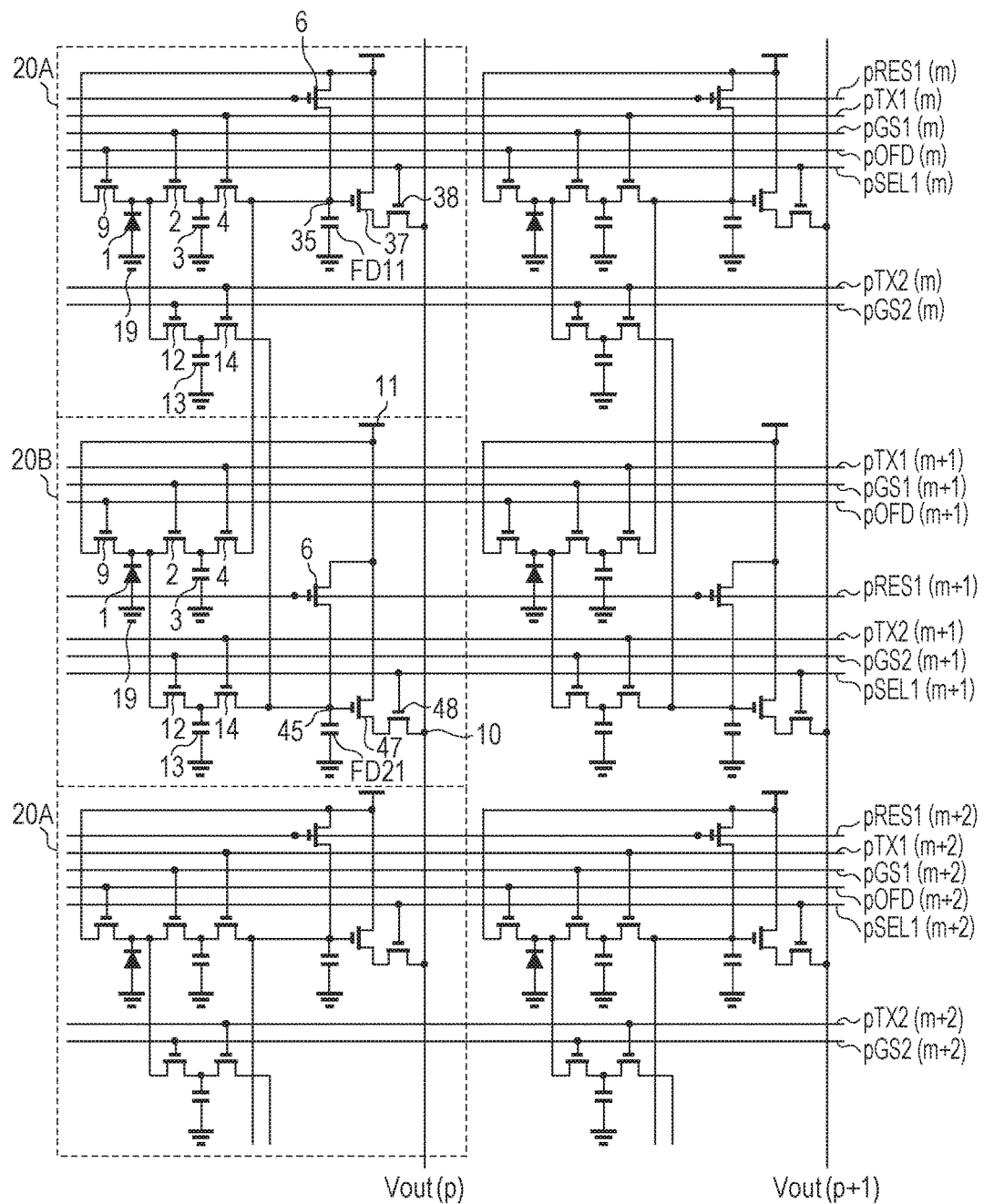
FIG. 2 illustrates a configuration of a unit cell.

FIG. 2 illustrates a detail of a configuration of the unit cells 20. The imaging sensor according to the present exemplary embodiment includes a unit cell 20A and a unit cell 20B as part of the unit cells 20. It should be noted that, in the following specification, the phrase "unit cell 20" is used in a case where an item common to all of the unit cells included in the imaging sensor is described. Each of the plurality of the unit cells 20 includes a single micro lens which is not illustrated in the drawing.

The unit cell 20 includes a single photodiode 1. The photodiode 1 is a photoelectric conversion unit configured to generate a signal corresponding to incident light. The photodiode 1 is connected to a grounding line 19. The unit cell 20 further includes a first transfer switch 2, a second transfer switch 4, a third transfer switch 12, and a fourth transfer switch 14. The first transfer switch 2, the second transfer switch 4, the third transfer switch 12, and the fourth transfer switch 14 according to the present exemplary embodiment respectively correspond to a first transfer unit, a second transfer unit, a third transfer unit, and a fourth transfer unit. The unit cell 20 further includes a first capacitor element 3 and a second capacitor element 13. Herein, a capacitance value of the first capacitor element 3 is equal to a capacitance value of the second capacitor element 13. The first capacitor element 3 is a first signal holding unit configured to hold a signal accumulated by the photodiode 1. The second capacitor element 13 is a second signal holding unit configured to hold the signal accumulated by the photodiode 1. According to the present exemplary embodiment, the single unit cell 20 corresponds to one set including the photoelectric conversion unit, the first transfer unit, the second transfer unit, the third transfer unit, the fourth transfer unit, the first signal holding unit, the second signal holding unit, and the amplification unit.

The photodiode 1 is electrically connected to the first capacitor element 3 via the first transfer switch 2. In addition, the photodiode 1 is electrically connected to the second capacitor element 13 via the third transfer switch 12.

The unit cell 20A includes a floating diffusion capacitance FD11, an amplification unit 37, and a selection switch 38. The floating diffusion capacitance FD11 is connected to an input node 35 of the amplification unit 37.

The unit cell 20B includes a floating diffusion capacitance FD21, an amplification unit 47, and a selection switch 48. The floating diffusion capacitance FD21 is connected to an input node 45 of the amplification unit 47.

A capacitance value of the floating diffusion capacitance FD11 is equal to a capacitance value of the floating diffusion capacitance FD21. Each of the floating diffusion capacitance FD11 and the floating diffusion capacitance FD21 is a floating diffusion portion formed by diffusing impurity over a silicon semiconductor layer.

The respective second transfer switches 4 of the unit cells 20A and 20B are connected to the input node 35 of the unit cell 20A. In addition, the respective fourth transfer switch 14 of the unit cells 20A and 20B are connected to the input node 45 of the unit cell 20B.

The amplification unit 37 is electrically connected to the column signal line 10 via the selection switch 38. In addition, the amplification unit 47 is electrically connected to the column signal line 10 via the selection switch 48. A power supply voltage 11 is supplied to both the amplification unit 37 and the amplification unit 47.

A current supply which is not illustrated in the drawing is electrically connected to the column signal line 10. In a case where the selection switch 38 is in an on state, the amplification unit 37 constitutes a source follower circuit with the power supply voltage 11 and the current supply that is electrically connected to the column signal line 10. In a case where the selection switch 48 is in an on state, the amplification unit 47 constitutes a source follower circuit with the power supply voltage 11 and the current supply that is electrically connected to the column signal line 10. In FIG. 2, a signal output to the column signal line 10 is represented as a signal Vout(p). Its suffix (p) represents a column number.

The unit cell 20 also includes a reset switch 6. The power supply voltage 11 is supplied to the reset switch 6. The reset switch 6 of the unit cell 20A is connected to the input node 35. A reset switch 16 of the unit cell 20B is connected to the input node 45.

The unit cells 20 further includes a PD reset switch 9. The power supply voltage 11 is supplied to the PD reset switch 9.

The second transfer unit (the second transfer switch 4) of a first unit cell (the unit cell 20A), the second transfer unit (the second transfer switch 4) of a second unit cell (the unit cell 20B), and an input node (the input node 35) of the first unit cell are connected to one another. In addition, the fourth transfer unit (the fourth transfer switch 14) of the first unit cell (the unit cell 20A), the fourth transfer unit (the fourth transfer switch 14) of the second unit cell (the unit cell 20B), and an input node (the input node 45) of the second unit cell are connected to one another.

As illustrated in FIG. 1, the unit cells 20 are electrically connected to the vertical scanning circuit 101 via the control lines 30. A signal pGS1(m) is input to a gate of the first transfer switch 2. Hereinafter, a suffix (m) of the signal input to the unit cells 20 represents a signal input to the unit cells 20 in the m-th row. In a case where signals input to the unit cells 20 are collectively represented, the suffix (m) is omitted for the representation.

A signal pTX(m) is input to a gate of the second transfer switch 4. A signal pGS2(m) is input to a gate of the third transfer switch 12. A signal pTX2(m) is input to a gate of the fourth transfer switch 14.

A signal pOFD(m) is input to a gate of the PD reset switch 9.

Signals pGS1 input to the respective unit cells 20 in the plurality of rows turn to an active level at the same timing and turn to a non-active level at the same timing. Signals pGS2 input to the respective unit cells 20 in the plurality of rows turn to the active level at the same timing and turn to the non-active level at the same timing. Signals pOFD input to the respective unit cells 20 in the plurality of rows turn to an active level at the same timing and turn to a non-active level at the same timing. As a result, the imaging sensor according to the present exemplary embodiment performs a global electronic shutter operation in which signal accumulation starting timings and signal accumulation ending timings of the photodiodes 1 are respectively matched with one another across all of the unit cells 20.

A signal pRES1(*m*) is input to a gate of the reset switch 6 of the unit cell 20A. The signal pRES1(*m*+1) is input to a gate of the reset switch 16 of the unit cell 20B.

A signal pSEL1(*m*) is input to the gate of the selection switch 38. The signal pSEL1(*m*+1) is input to the gate of the selection switch 48.

Operation of the Imaging Sensor

Next, with reference to FIG. 3 and FIG. 4, an operation of the imaging sensor illustrated in FIG. 1 and FIG. 2 will be described.

Figure 3:
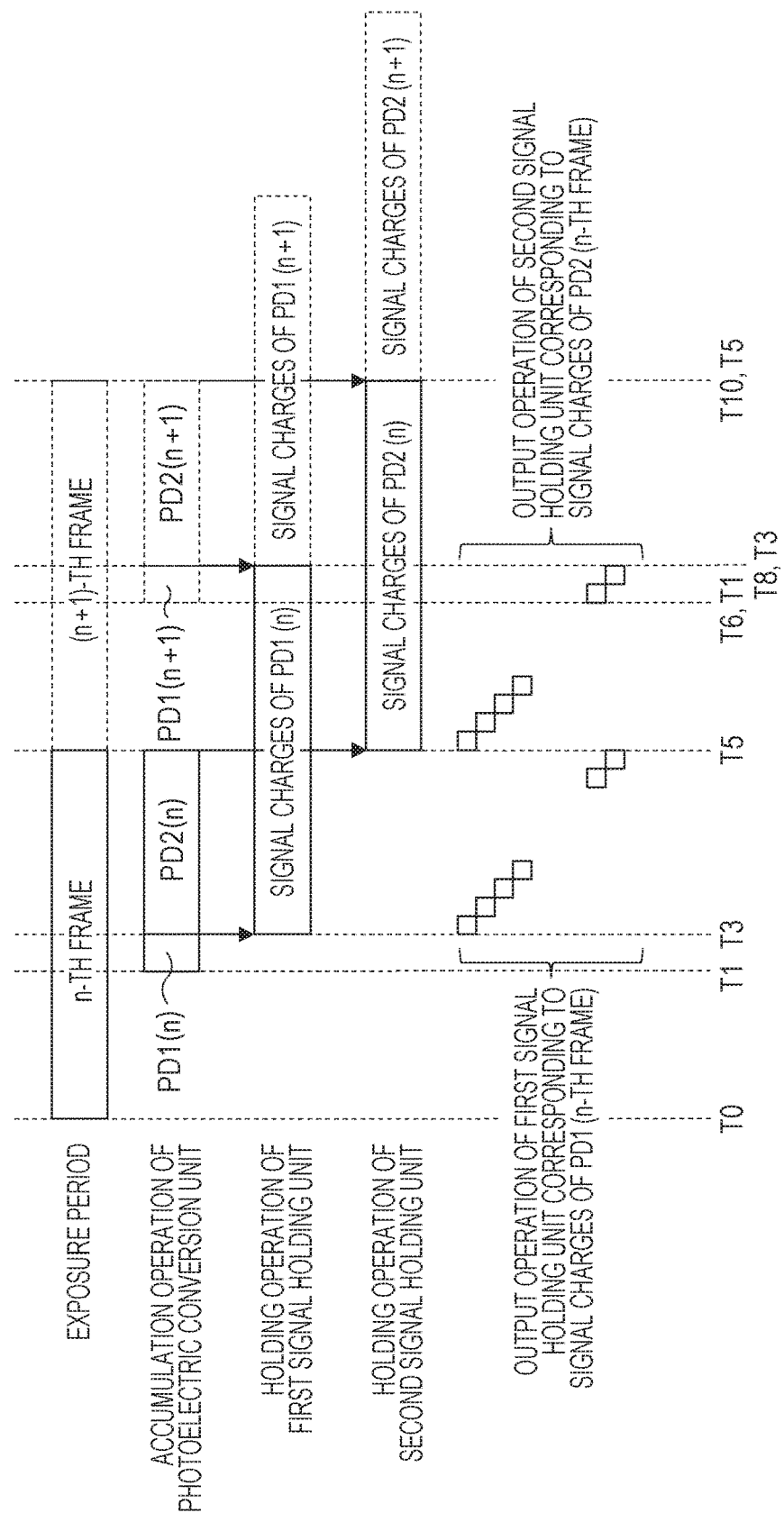
FIG. 3 illustrates an operation of the unit cell.
Figure 4:
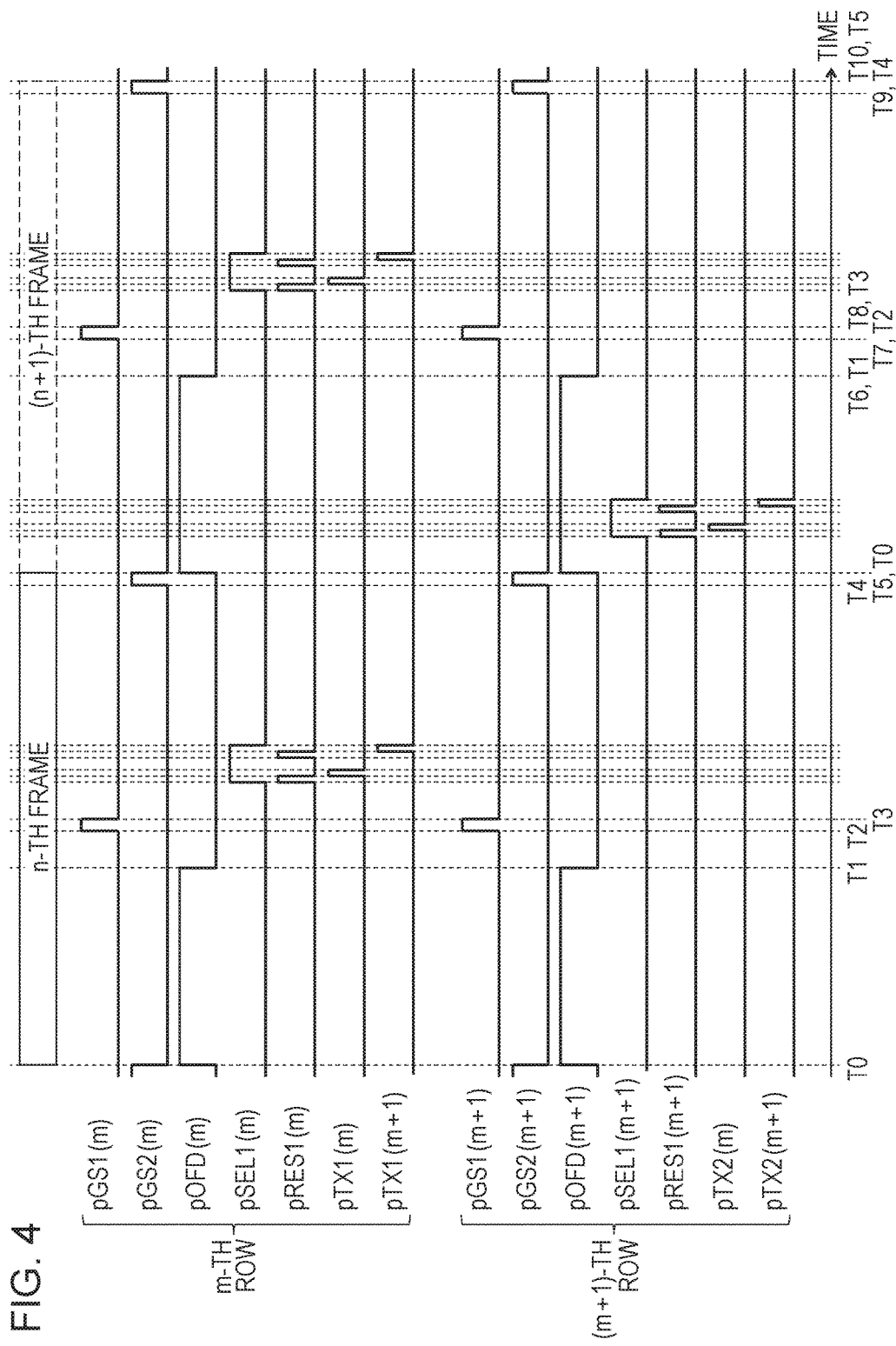
FIG. 4 illustrates the operation of the unit cell.

FIG. 3 and FIG. 4 illustrate the operation of the imaging sensor at an n-th frame and an (n+1)-th frame. The time illustrated in FIG. 3 corresponds to the time illustrated in FIG. 4. A period of one frame is a period from when signal reading from the unit cells 20 in a predetermined row is started until the signal reading from the unit cells 20 in the predetermined row is started again for the next time. Alternatively, the one frame period can also be a period from when a vertical synchronization signal for causing the vertical scanning circuit 101 to start vertical scanning turns to the active level until the vertical synchronization signal turns to the active level again for the next time.

Descriptions will be given with reference to FIG. 4. With regard to a signal illustrated in FIG. 4, High level of the signal corresponds to the active level at which a switch to the signal is input turns to the on state. On the other hand, Low level of the signal corresponds to the non-active level at which the switch to the signal is input turns to the off state.

During a period from a time T0 to a time T1, the vertical scanning circuit 101 sets the signal pOFD supplied to the unit cells 20 in all of the rows at the active level. As a result, the signals generated by the photodiodes 1 are discharged by the power supply voltage 11 from the photodiodes 1.

At the time T1, the vertical scanning circuit 101 sets the signal pOFD supplied to the unit cells 20 in all of the rows at the non-active level. As a result, an electronic shutter operation is performed in which the photodiodes 1 of all of the unit cells 20 start signal accumulation at the same time.

At a time T2, the vertical scanning circuit 101 sets the signal pGS1 supplied to the unit cells 20 in all of the rows at the active level. Subsequently, at a time T3, the vertical scanning circuit 101 sets the signal pGS1 at the non-active level. As a result, a global transfer operation is performed in which the first capacitor elements 3 of all of the unit cells 20 hold the signals accumulated by the photodiodes 1 at the same time during a period from the time T1 until the time T3. The period from the time T1 until the time T3 corresponds to a first accumulation period in which the photodiodes 1 accumulates the signals.

Thereafter, the vertical scanning circuit 101 sets a signal PSEL1(*m*) at the active level to put the selection switches 38 in the m-th row in the on state. Subsequently, the vertical scanning circuit 101 sets the signal pRES1(*m*) at the active level and then sets the signal pRES1(*m*) at the non-active level to reset a potential of the input node 35. Subsequently, the vertical scanning circuit 101 sets a signal pTX1(*m*) at the active level and then sets the signal pTX1(*m*) at the non-active level. As a result, the signal held in the first capacitor element 3 of the unit cell 20A is transferred to the floating diffusion capacitance FD11. Therefore, the amplification unit 37 outputs a signal based on the signal accumulated by the photodiode 1 of the unit cell 20A to the column signal line 10 via the selection switch 38 during the first accumulation period.

Next, the vertical scanning circuit 101 sets the signal pRES1(*m*) at the active level to reset the potential of the input node 35. Subsequently, the vertical scanning circuit 101 sets the signal pRES1(*m*) at the non-active level to release the resetting of the input node 35. Subsequently, the vertical scanning circuit 101 sets the signal pTX1(*m*+1) at the active level and then sets the signal pTX1(*m*+1) at the non-active level. As a result, the signal held by the first capacitor element 3 of the unit cell 20B is transferred to the floating diffusion capacitance FD11. Therefore, the amplification unit 37 outputs a signal based on the signal accumulated by the photodiode 1 of the unit cell 20B to the column signal line 10 via the selection switch 38 during the first accumulation period.

Thereafter, the vertical scanning circuit 101 performs the same operation as the operation for the respective unit cells 20 in the m-th row and the (m+1)-th row with respect to the unit cells 20 in the (m+2)-th row and the (m+3)-th row (not illustrated). In this manner, the vertical scanning circuit 101 sequentially reads out a first optical signal that is a signal corresponding to the first accumulation period of the unit cells 20 in the respective rows to the column signal line 10.

At a time T4, the vertical scanning circuit 101 sets the signal pGS2 supplied to the unit cells 20 in all of the rows at the active level. Subsequently, at a time T5, the vertical scanning circuit 101 sets the signal pGS2 at the non-active level. As a result, the global transfer operation is performed in which the second capacitor elements 13 of all of the unit cells 20 hold the signal accumulated by the photodiode 1 during a period from the time T3 to the time T5 at the same time. The period from the time T3 to the time T5 corresponds to a second accumulation period in which the photodiode 1 accumulates the signal. The second accumulation period is a period longer than the first accumulation period. In addition, the first accumulation period and the second accumulation period have no overlapping periods at all.

Thereafter, the vertical scanning circuit 101 sets the signal PSEL1(*m*+1) at the active level to put the selection switch 48 in the (m+1)-th row in the on state. Subsequently, the vertical scanning circuit 101 sets the signal pRES1(*m*+1) at the active level and then sets the signal pRES1(*m*+1) at the non-active level to reset a potential of the input node 45. Subsequently, the vertical scanning circuit 101 sets the signal pTX2(*m*) at the active level and then sets the signal pTX2(*m*) at the non-active level. As a result, the signal held by the second capacitor element 13 of the unit cell 20A is transferred to the floating diffusion capacitance FD21. Therefore, the amplification unit 47 outputs the signal based on the signal accumulated by the photodiode 1 of the unit cell 20A to the column signal line 10 via the selection switch 48 during the second accumulation period.

Next, the vertical scanning circuit 101 sets the signal pRES1(*m*+1) at the active level again to reset the potential of the input node 45. Subsequently, the vertical scanning circuit 101 sets the signal pRES1(*m*+1) at the non-active level to cancel the resetting of the input node 45. Subsequently, the vertical scanning circuit 101 sets the signal pTX2(*m*+1) at the active level and then sets the signal pTX2(*m*+1) at the non-active level. As a result, the signal held by the second capacitor element 13 of the unit cell 20B is transferred to the floating diffusion capacitance FD21. Therefore, the amplification unit 47 outputs the signal based on the signal accumulated by the photodiode 1 of the unit cell 20B to the column signal line 10 via the selection switch 48 during the second accumulation period.

Thereafter, the vertical scanning circuit 101 performs the same operation as the operation for the respective unit cells 20 in the m-th row and the (m+1)-th row with respect to the unit cells 20 in the (m+2)-th row and the (m+3)-th row (not illustrated). In this manner, the vertical scanning circuit 101 sequentially reads out a second optical signal that is a signal corresponding to the unit cells 20 in the respective rows during the second accumulation period to the column signal line 10.

It should be noted that the vertical scanning circuit 101 sets the signal pOFD supplied to the unit cells 20 in all of the rows at the active level again during a period from the time T5 until a time T6. As a result, the signals of the photodiodes 1 of all of the unit cells 20 are reset similarly as in the previous operation from the time T0 until the time T1.

After that, in the (n+1)-th frame too, the imaging sensor according to the present exemplary embodiment repeats the same operation as that in the n-th frame.

Next, the imaging sensor according to the present exemplary embodiment will be described. According to the present exemplary embodiment, the second accumulation period is set to be longer than the first accumulation period. For example, the second accumulation period is set to be 10 times as long as the first accumulation period.

A dynamic range (DR) is defined by the following expression.

Dynamic range=20*Log(S/N)

It should be noted that the symbol "*" means a multiplication in the present specification. In addition, a base in a case where Log is simply described is 10.

The dynamic range in a case where one image is generated by using both the signals corresponding to the second accumulation period and the signals corresponding to the first accumulation period is increased by 20 dB as compared with a case where one image is generated by using only the signals corresponding to the first accumulation period. The signal held by the first capacitor element 3 is equivalent to a signal generated at one tenth as high as a sensitivity used to generate the signal held by the second capacitor element 13. Therefore, even when the signal held by the first capacitor element 3 is saturated, the signal held by the second capacitor element 13 can be read out without saturation. As may be understood from this, the dynamic range is increased by 20 dB towards a high luminance side in the imaging sensor according to the present exemplary embodiment.

In addition, the mutual first capacitor elements 3 that hold the signals corresponding to the first accumulation period of the plurality of respective unit cells are connected to a common input node in the imaging sensor according to the present exemplary embodiment. As a result, as compared with a case where the first capacitor elements 3 that hold the signals corresponding to the first accumulation period of the plurality of respective unit cells are connected to separate input nodes, it is possible to reduce the circuit area of the amplification unit.

In addition, the mutual second capacitor elements 13 that hold the signals corresponding to the second accumulation period of the plurality of respective unit cells are connected to a common input node in the imaging sensor according to the present exemplary embodiment. As a result, as compared with a case where the first capacitor elements 3 that hold the signals corresponding to the second accumulation period of the plurality of respective unit cells are connected to separate input nodes, it is possible to reduce the circuit area of the amplification unit.

According to the first exemplary embodiment, the signals respectively held by the first capacitor element 3 and the second capacitor element 13 are signals having different lengths of the accumulation periods. In this manner, while the lengths of the accumulation periods to which the signals held by the first capacitor element 3 and the second capacitor element 13 correspond are set to be different from each other, the imaging sensor according to the first exemplary embodiment realizes high functionality for expanding the dynamic range.

In addition, with regard to the imaging sensor according to the first exemplary embodiment, the mutual first capacitor elements 3 are connected to a common input node in the plurality of unit cells 20. As a result, it is possible to add the mutual signals held by the first capacitor elements 3 of the plurality of the respective unit cells 20 by using the floating diffusion capacitance FD11. The mutual second capacitor elements 13 are also connected to a common input node in the plurality of unit cells 20. As a result, it is possible to add the mutual signals held by the second capacitor elements 13 of the plurality of the respective unit cells 20 by using the floating diffusion capacitance FD21.

As a result, the imaging sensor according to the first exemplary embodiment can read out the signal obtained by adding the mutual signals having the same length of the accumulation period while a vertical scanning period is shortened.

Modified Example of the First Exemplary Embodiment

A modified example of the first exemplary embodiment will be described with reference to FIG. 5 and FIG. 6. According to this modified example, the imaging sensor performs repetitive operations during the accumulation period and the one frame period. That is, each of the first accumulation period and the second accumulation period is repeated during the one frame period.

Figure 5:
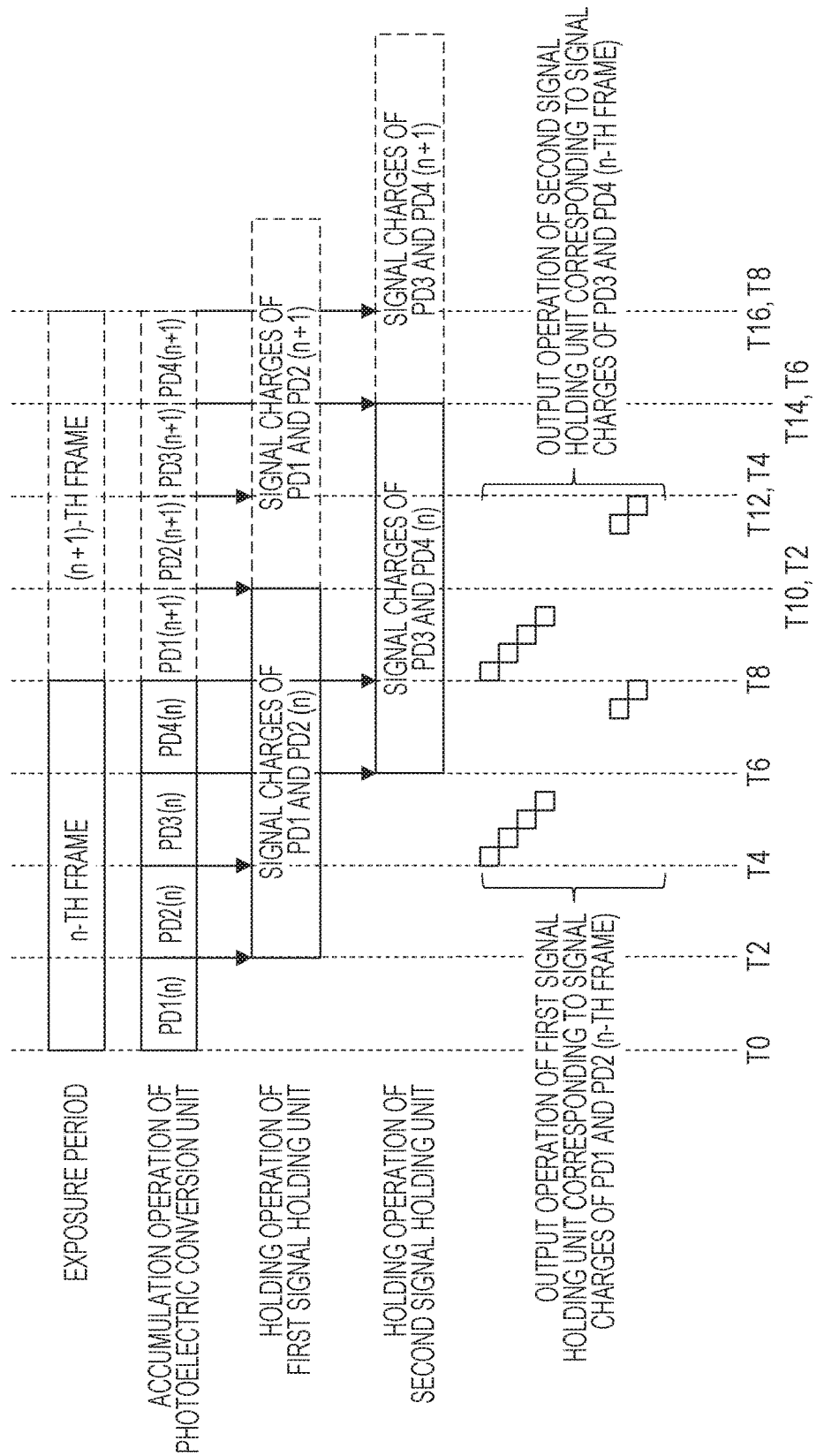
FIG. 5 illustrates the operation of the unit cell.

In FIG. 5, at the time T0, the charge accumulation in the n-th frame is started. The photodiode 1 accumulates a signal during a period from the time T0 until the time T2. This signal is represented as a signal PD1(n). At the time T2, the first capacitor element 3 holds the signal PD1(n) accumulated by the photodiode 1. The period from the time T0 until the time T2 during which the photodiode 1 holds the signal corresponds to the first accumulation period.

The photodiode 1 accumulates a signal during a period from the time T2 until the time T4. This signal is represented as a signal PD2(n). The period from the time T2 until the time T4 also corresponds to the first accumulation period during which the photodiode 1 accumulates the charges. The first capacitor element 3 holds a signal PD1+2(n) contained by adding the signal PD2(n) accumulated by the photodiode 1 to the signal PD1(n) already held by the first capacitor element 3 at the time T4. The first capacitor element 3 holds the signal PD1+2(n) until a time T10. That is, the first capacitor element 3 holds the signal corresponding to the two first accumulation periods.

At the time T4 and thereafter, the vertical scanning circuit 101 reads out the signal corresponding to the signal PD1+2(n) in units of row from the plurality of unit cells 20 arranged in rows and columns.

The photodiode 1 accumulates a signal during a period from the time T6 until a time T8. This signal is represented as a signal PD3(*n*). At the time T8, the second capacitor element 13 holds the signal PD3(*n*) accumulated by the photodiode 1. The period from the time T6 until the time T8 during which the photodiode 1 holds the signal corresponds to the second accumulation period.

The photodiode 1 accumulates a signal during a period from the time T8 until the time T10. This signal is represented as a signal PD4(*n*). The period from the time T8 until the time T10 also corresponds to the second accumulation period during which the photodiode 1 accumulates the charges. The second capacitor element 13 holds a signal PD3+4(*n*) obtained by adding the signal PD4(*n*) accumulated by the photodiode 1 to the signal PD3(*n*) already held by the second capacitor element 13 at the time T10. The second capacitor element 13 holds the signal PD3+4(*n*) until a time T14. That is, the second capacitor element 13 holds the signal corresponding to the two second accumulation periods.

At the time T8 and thereafter, the vertical scanning circuit 101 reads out the signal corresponding to the signal PD3+4(*n*) in units of row from the plurality of unit cells 20 arranged in rows and columns.

The operation in the (n+1)-th frame following the n-th frame is also the same as the operation in the n-th frame.

Figure 6:
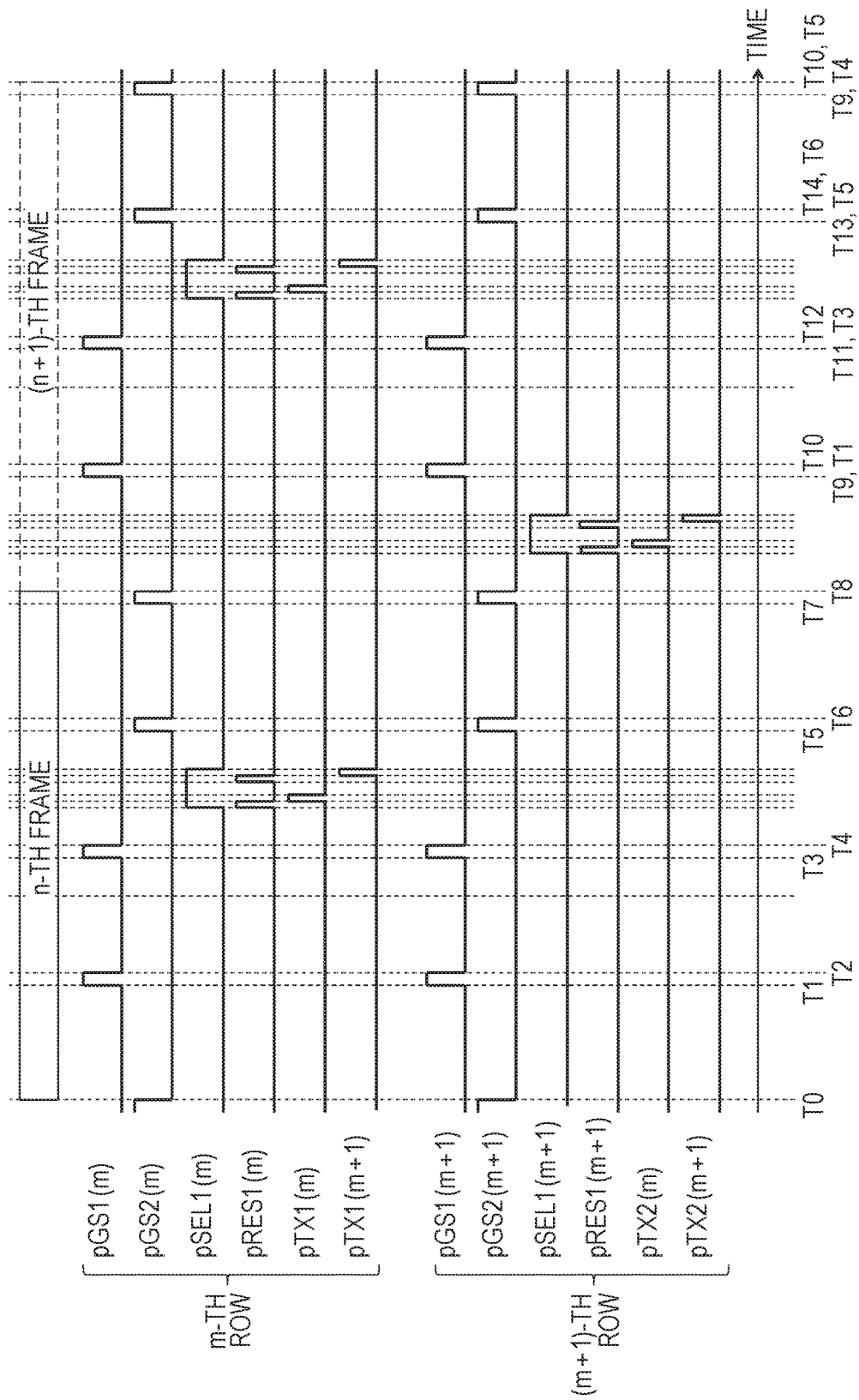
FIG. 6 illustrates the operation of the unit cell.

FIG. 6 illustrates a detail of the operation illustrated in FIG. 5. Respective times illustrated in FIG. 6 correspond to the respective times illustrated in FIG. 5.

Here, different aspects from the operation illustrated in FIG. 4 will be mainly described. In the operation of FIG. 6, the signal pOFD is not illustrated in the drawing, but the signal pOFD in all of the rows is set at the non-active level.

The vertical scanning circuit 101 sets the signal pGS1 in all of the rows at the active level at the time T1 and sets the signal pGS1 at the non-active level at the time T2. As a result, the signal PD1(*n*) corresponding to the signal accumulated by the photodiode 1 is transferred to the first capacitor element 3 during the period from the time T0 until the time T2.

The vertical scanning circuit 101 also sets the signal pGS1 in all of the rows at the active level at the time T3 and sets the signal pGS1 at the non-active level at the time T4. As a result, the signal PD2(*n*) corresponding to the signal accumulated by the photodiode 1 is transferred to the first capacitor element 3 during a period from the time T3 until the time T4. The first capacitor element 3 already holds the signal PD1(*n*) transferred from the photodiode 1 at the time T2. Therefore, the first capacitor element 3 holds the signal corresponding to the signal PD1+2(*n*) that is the signal obtained by adding the signal PD1(*n*) to the signal PD2(*n*).

Thereafter, the vertical scanning circuit 101 sets the signal PSEL1(*m*) at the active level. Subsequently, after the signal PRES1(*m*) is set at the active level, the vertical scanning circuit 101 sets signal PRES1(*m*) at the non-active level. Subsequently, after a signal PTX1(*m*) is set at the active level, the signal PTX1(*m*) is set at the non-active level. As a result, the amplification unit 37 outputs the signal corresponding to the signal PD1+2(*n*) to the column signal line 10.

The vertical scanning circuit 101 sets the signal pGS2 in all of the rows at the active level at the time T5 and sets the signal pGS2 at the non-active level at time T6. As a result, the signal PD3(*n*) corresponding to the signal accumulated by the photodiode 1 is transferred to the second capacitor element 13 during a period from the time T4 until the time T5.

The vertical scanning circuit 101 also sets the signal pGS2 in all of the rows at the active level at a time T7 and sets the signal pGS2 at the non-active level at the time T8. As a result, the signal PD4(*n*) corresponding to the signal accumulated by the photodiode 1 is transferred to the second capacitor element 13 during a period from the time T7 until the time T8. The second capacitor element 13 already holds the signal PD3(*n*) transferred from the photodiode 1 at the time T5. Therefore, the second capacitor element 13 holds the signal corresponding to the signal PD3+4(*n*) that is the signal obtained by adding the signal PD3 (*n*) to the signal PD4(*n*).

Thereafter, the vertical scanning circuit 101 sets the signal PSEL1(*m*+1) at the active level. Subsequently, after the signal PRES1(*m*+1) is set at the active level, the vertical scanning circuit 101 sets the signal PRES1(*m*+1) at the non-active level. Subsequently, the signal PTX1(*m*+1) is set at the active level, and then the signal PTX1(*m*+1) is set at the non-active level. As a result, the amplification unit 47 outputs the signal corresponding to the signal PD3+4(*n*) to the column signal line 10.

In this manner, the imaging sensor according to the modified example can also read out the signal accumulated by the photodiode 1 in the n-th frame.

Descriptions will be given of the modified example. According to the modified example, the signal PD1(*n*) and the signal PD2(*n*) are held by the first capacitor element 3, and the signal PD3(*n*) and the signal PD4(*n*) are held by the second capacitor element 13. For this reason, the photodiode 1 can read out the signals accumulated at the different timings in the one frame period. Therefore, moving body detection, for example, can be performed by using the signals accumulated at the different timings in the one frame period.

According to the modified example, the signals respectively held by the first capacitor element 3 and the second capacitor element 13 are the signals having different timings of the accumulation periods. In this manner, while the timings of the accumulation periods to which the signals held by the first capacitor element 3 and the second capacitor element 13 correspond are set to be different from each other, the imaging sensor according to the modified example realizes the high functionality with which the moving body detection can be performed, for example.

With regard to the imaging sensor according to the modified example too, similarly as in the imaging sensor according to the first exemplary embodiment, the mutual first capacitor elements 3 are connected to the common input node in the plurality of unit cells 20. As a result, it is possible to add the mutual signals held by the first capacitor elements 3 of the plurality of the respective unit cells 20 by using the floating diffusion capacitance FD11. The mutual second capacitor elements 13 are also connected to the common input node in the plurality of unit cells 20. As a result, it is possible to add the mutual signals held by the second capacitor element 13 of the plurality of the respective unit cells 20 by using the floating diffusion capacitance FD21.

As a result, the imaging sensor according to the modified example can read out the signal obtained by adding the mutual signals having the same timing of the accumulation period while the vertical scanning period is shortened.

It should be noted that, according to this modified example, the two first accumulation periods and the two second accumulation periods are provided in the one frame period, but the configuration is not limited to this example. The more first accumulation periods and the more second accumulation periods may be further provided in the one frame period. In this case, the imaging sensor according to the modified example is facilitated to detect the moving body at a still higher accuracy.

It should be noted that the first exemplary embodiment may be combined with the modified example. That is, the first accumulation period and the second accumulation period may have different lengths, and a plurality of the first accumulation periods and a plurality of the second accumulation period may be provided in the one frame period.

It should be noted that, according to the present exemplary embodiment, it is sufficient when synchronicity in each of the electronic shutter operation and the global transfer operation is set to be at a practically acceptable level. When all of the unit cells 20 are driven completely at the same time, large load is applied to a driving driver. To alleviate this load, a configuration may be adopted in which a small time difference between the plurality of unit cells 20 may be provided in each of the electronic shutter operation and the global transfer operation. In the above-described case too, each of the electronic shutter operation and the global transfer operation falls within a category of a relationship in substantially "at the same time".

Second Exemplary Embodiment

Different aspects of the imaging sensor according to the present exemplary embodiment from the first exemplary embodiment will be mainly described.

Figure 7:
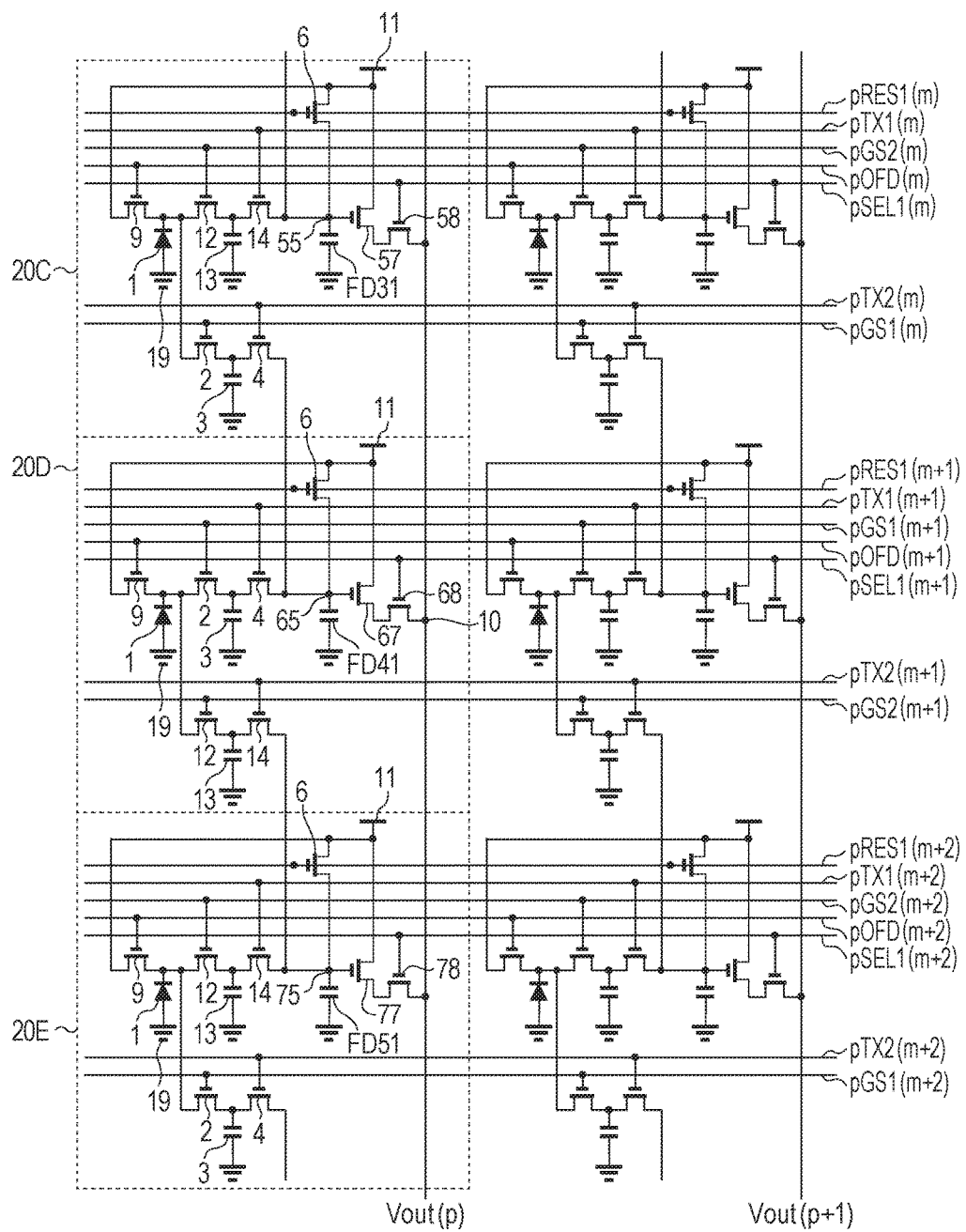
FIG. 7 illustrates the configuration of the unit cell.

FIG. 7 illustrates a configuration of the unit cells 20 of the imaging sensor according to the present exemplary embodiment.

In the unit cells 20A and 20B of the imaging sensor according to the first exemplary embodiment, the second transfer switch 4 of the unit cell 20B is connected to the input node 35 of the unit cell 20A via a wiring (first wiring). In addition, the fourth transfer switch 14 of the unit cell 20A is connected to the input node 45 of the unit cell 20B via a wiring (second wiring). In the case of this connection relationship, an area exists where the first wiring and the second wiring extend in parallel in the unit cell 20A and the unit cell 20B. In the case of this layout, decrease in the signal accuracy of the signal transferred to the input node may occur because of a parasitic capacitance caused by the first wiring and the second wiring extending in parallel. In addition, when the first wiring and the second wiring are arranged so as to increase a distance between the first wiring and the second wiring such that a capacitance value of the parasitic capacitance is decreased, the circuit area of unit cells is increased.

The imaging sensor according to the present exemplary embodiment includes unit cells 20C, 20D, and 20E. The unit cell 20C includes a floating diffusion capacitance FD31, an input node 55, an amplification unit 57, and a selection switch 58.

The unit cell 20D includes a floating diffusion capacitance FD41, an input node 65, an amplification unit 67, and a selection switch 68.

The unit cell 20E includes a floating diffusion capacitance FD51, an input node 75, an amplification unit 77, and a selection switch 78.

Capacitance values of the floating diffusion capacitances FD31 and FD51 are equal to each other. In addition, a capacitance value of the floating diffusion capacitance FD41 is higher than the capacitance values of the floating diffusion capacitances FD31 and FD51.

The second transfer switch 4 of the unit cell 20C is connected to the input node 65 of the unit cell 20D. The fourth transfer switch 14 of the unit cell 20D is connected to the input node 75 of the unit cell 20E.

That is, the unit cell 20D is provided as the first unit cell corresponding to one unit cell as part of the plurality of unit cells 20. In addition, the unit cell 20C is provided as the second unit cell corresponding to one unit cell as another part of the plurality of unit cells 20. Moreover, the unit cell 20E is provided as a third unit cell corresponding to one unit cell as another part of the plurality of unit cells 20. The second transfer switch 4 corresponding to the second transfer unit of the first unit cell and the second transfer switch 4 corresponding to the second transfer unit of the second unit cell are connected to the input node 65 corresponding to the input node of the first unit cell. In addition, the fourth transfer switch 14 corresponding to the fourth transfer unit of the first unit cell and the fourth transfer switch 14 corresponding to the fourth transfer unit of the third unit cell are connected to the input node 75 corresponding to the input node of the third unit cell. The second unit cell, the first unit cell, and the third unit cell are arranged in the stated order without the intermediation of other unit cells therebetween.

With this configuration, it is possible to arrange the mutual wirings that connect the transfer switch of one unit cell of the plurality of unit cells to the input node of the other unit cell which are not extended in parallel. As a result, it is possible to reduce the parasitic capacitance, which exists in the imaging sensor according to a fifth exemplary embodiment, caused by the configuration in which the first wiring and the second wiring extend in parallel. As a result, the imaging sensor according to the present exemplary embodiment can suppress the occurrence of the decrease in the signal accuracy of the signal transferred to the input node.

Third Exemplary Embodiment

Different aspects of the imaging sensor according to the present exemplary embodiment from the second exemplary embodiment will be mainly described.

Figure 8:
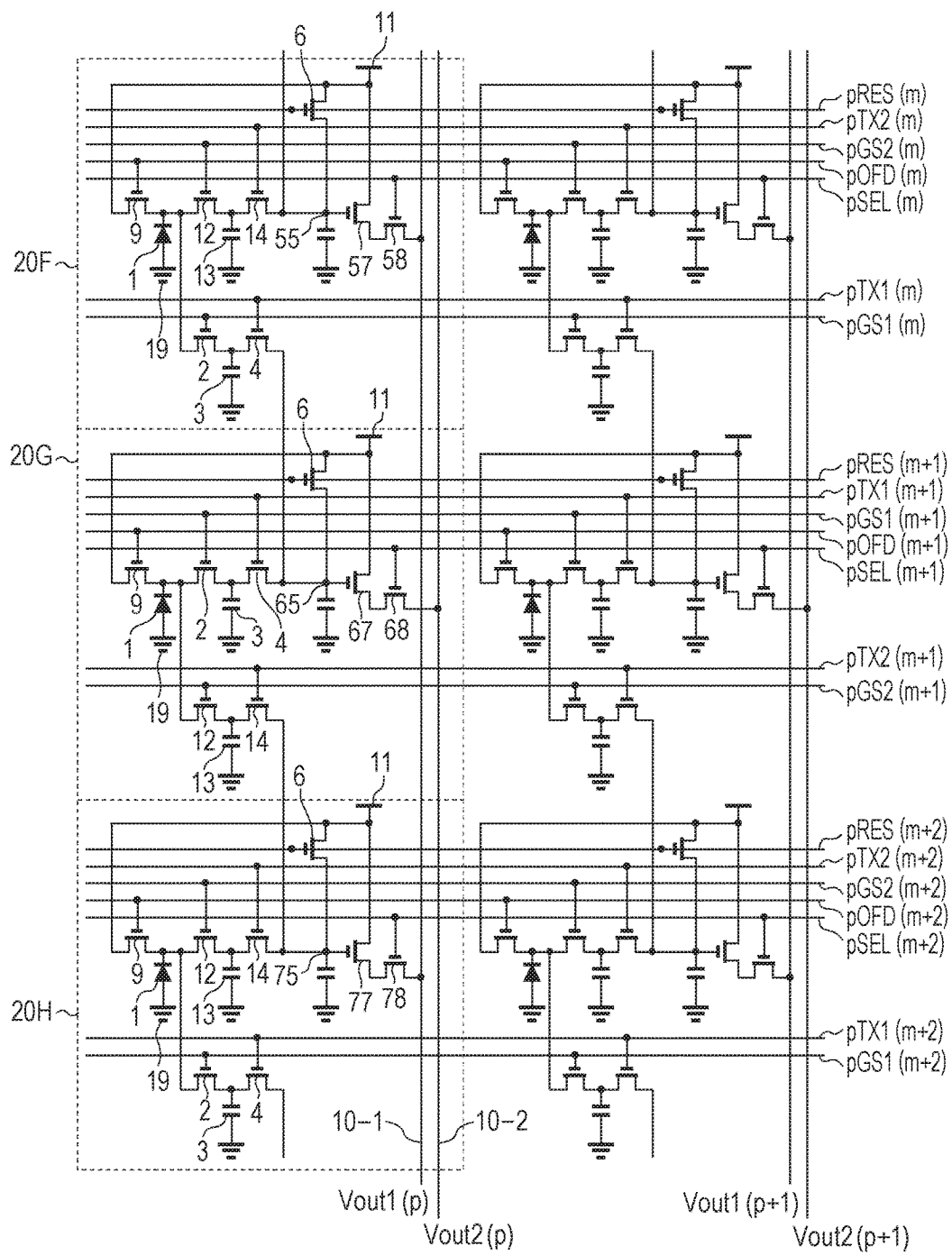
FIG. 8 illustrates the configuration of the unit cell.

FIG. 8 illustrates the configuration of the unit cells 20 according to the present exemplary embodiment. The imaging sensor according to the present exemplary embodiment is different from the imaging sensor according to the second exemplary embodiment in that the plurality of column signal lines 10 are arranged with respect to the unit cells 20 in one column.

Unit cells 20F, 20G, and 20H are arranged in one column in the imaging sensor according to the present exemplary embodiment. Column signal lines 10-1 and 10-2 are arranged with respect to the unit cells 20F, 20G, and 20H in the one column.

The selection switches 48 of the unit cells 20F and 20H in an odd-numbered row are connected to the column signal line 10-1. On the other hand, the selection switch 38 of the unit cell 20G in an even-numbered row is connected to the column signal line 10-2.

A signal Vout1($p$) corresponding to the signal held by the second capacitor element 13 is output to the column signal line 10-1. In addition, a signal Vout2($p$) corresponding to the signal held by the first capacitor elements 3 is output to the column signal line 10-2. That is, the respective signals of the unit cells 20 in the plurality of rows output to the one column signal line 10-1 are the signals corresponding to the same second accumulation period. Therefore, the column circuit unit 102 described with reference to FIG. 1 can add the mutual signals corresponding to the second accumulation period which are output to the single column signal line 10-1 from the respective unit cells 20 in the plurality of rows. Similarly, the respective signals of the unit cells 20 in the plurality of rows which are output to the single column signal line 10-2 are the signals corresponding to the same first accumulation period. Therefore, the column circuit unit 102 described with reference to FIG. 1 can add the mutual signals corresponding to the first accumulation period which are output to the single column signal line 10-2 from the respective unit cells 20 in the plurality of rows.

In addition, the imaging sensor according to the present exemplary embodiment is provided with the plurality of column signal lines with respect to the unit cells 20 in the single column, so that the signal readout of the unit cells 20 in the odd-numbered row and the signal readout of the unit cells 20 in the even-numbered row can be performed in parallel. As a result, the vertical scanning period can be shortened with respect to the imaging sensor according to the first exemplary embodiment.

Fourth Exemplary Embodiment

Different aspects of the imaging sensor according to the present exemplary embodiment from the first exemplary embodiment will be mainly described. In the imaging sensor according to the present exemplary embodiment, the mutual gates of the respective first transfer switches 2 of the first unit cell and the second unit cell are connected to the same control line. In addition, in the imaging sensor according to the present exemplary embodiment, the mutual gates of the respective third transfer switches 12 of the second unit cell and the third unit cell are connected to the same control line.

Figure 9:
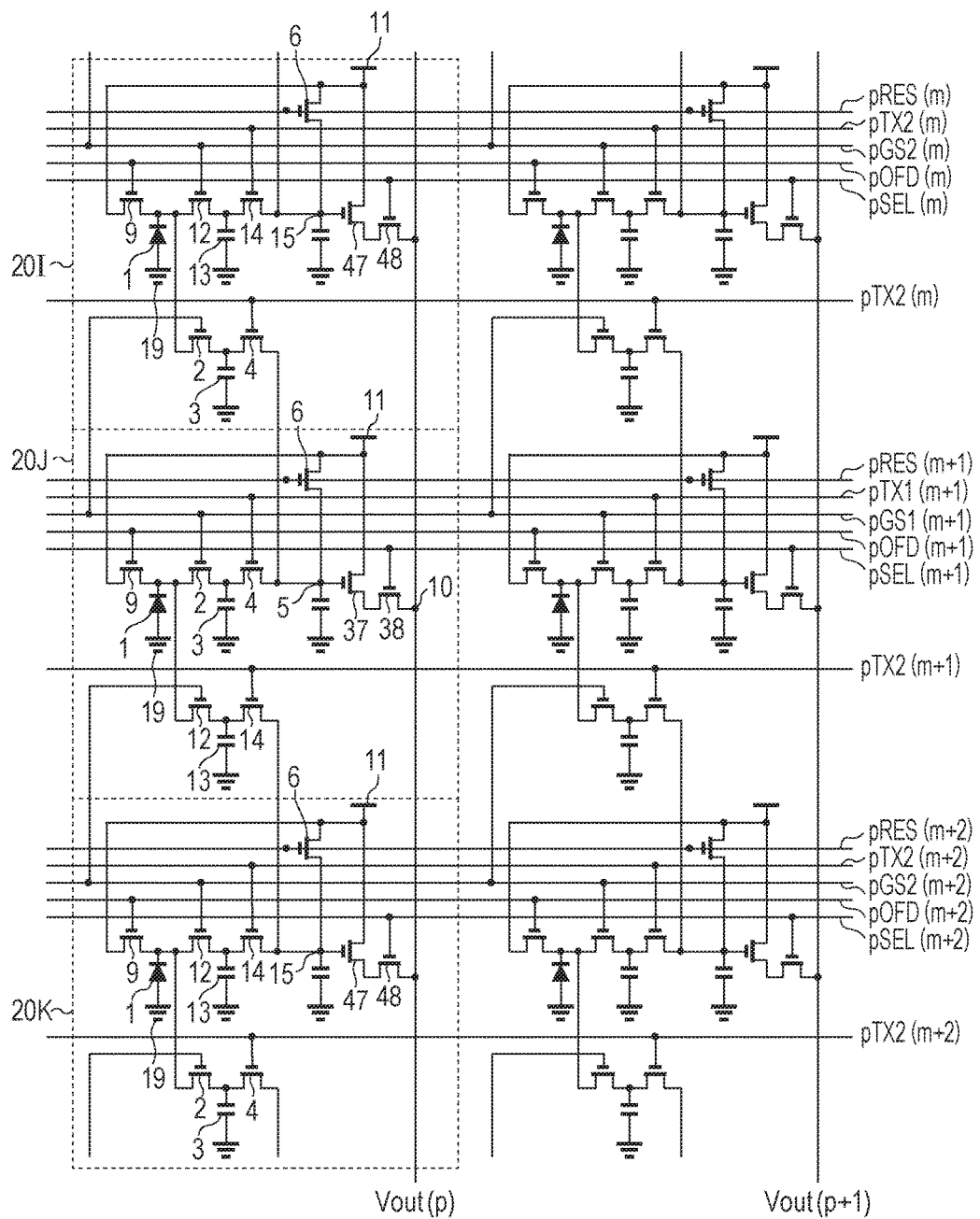
FIG. 9 illustrates the configuration of the unit cell.

FIG. 9 illustrates the configuration of the unit cells 20 of the imaging sensor according to the present exemplary embodiment. The imaging sensor according to the present exemplary embodiment includes unit cells 20I, 20J, and 20K. The unit cell 20I includes an input node 15. The unit cell 20J includes an input node 5. The unit cell 20K includes the input node 15.

The mutual gates of the respective first transfer switches 2 of the unit cell 20I and the unit cell 20J are connected to the same control line for transmitting the signal pGS1.

The mutual gates of the respective third transfer switches 12 of the unit cell 20J and the unit cell 20K are connected to the same control line for transmitting the signal pGS2.

Operations of the unit cells 20I, 20J, and 20K illustrated in FIG. 9 can be set as the same as the operation in FIG. 4 described according to the first exemplary embodiment.

Figure 10:
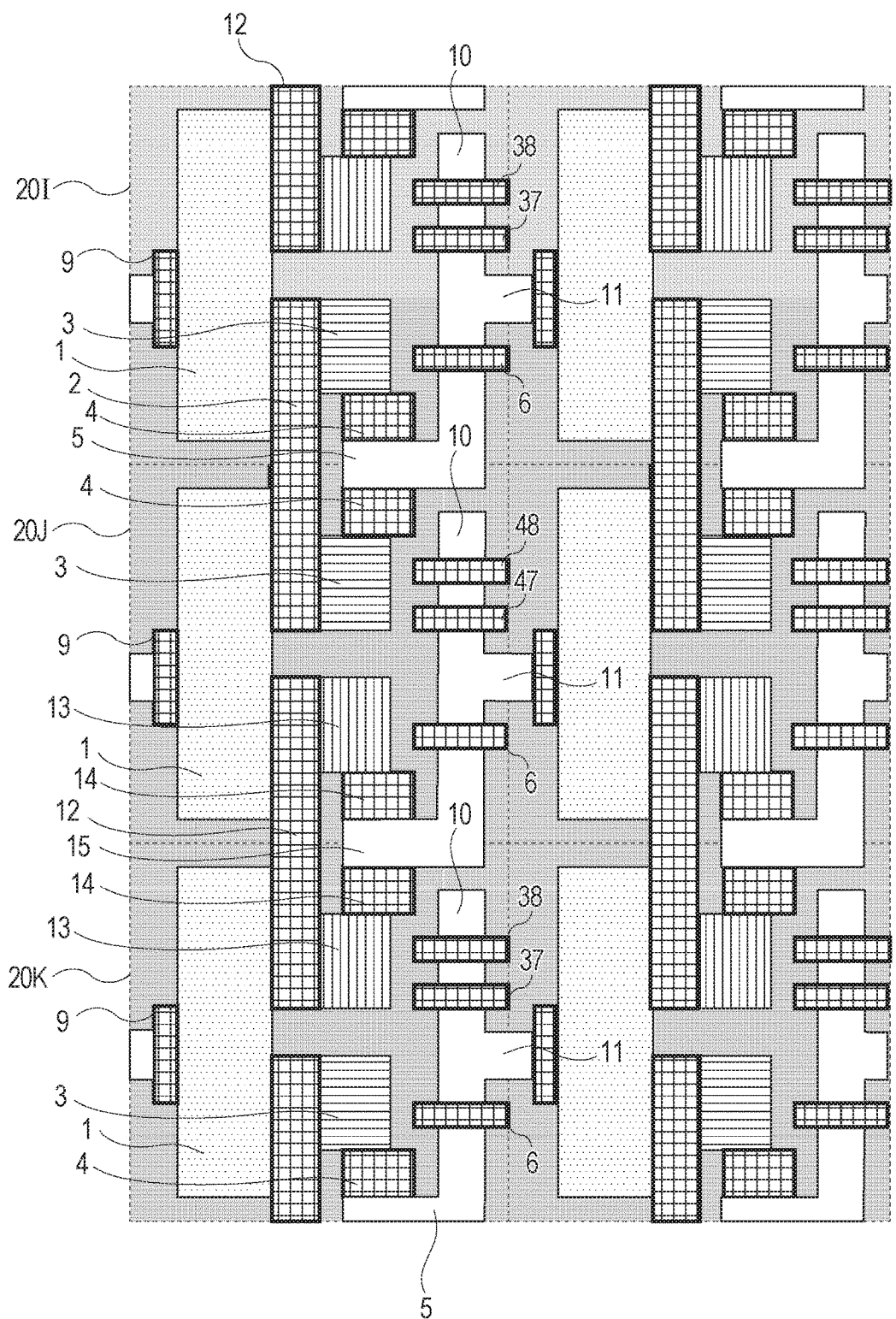
FIG. 10 illustrates a layout of the unit cell.

FIG. 10 illustrates a layout of the unit cells 20 illustrated in FIG. 9. Reference symbols assigned in FIG. 10 correspond to the reference symbols assigned in FIG. 9.

In the imaging sensor according to the present exemplary embodiment, the mutual gates of the respective first transfer switches 2 of the first unit cell and the second unit cell are connected to the same control line. In addition, in the imaging sensor according to the present exemplary embodiment, the mutual gates of the respective third transfer switches 12 of the second unit cell and the third unit cell are connected to the same control line. As a result, the number of control lines for transmitting the signal pGS1 and the signal pGS2 can be decreased as compared with that of the imaging sensor according to the first exemplary embodiment.

Fifth Exemplary Embodiment

Different aspects of the imaging sensor according to the present exemplary embodiment from the first exemplary embodiment will be mainly described.

Figure 11:
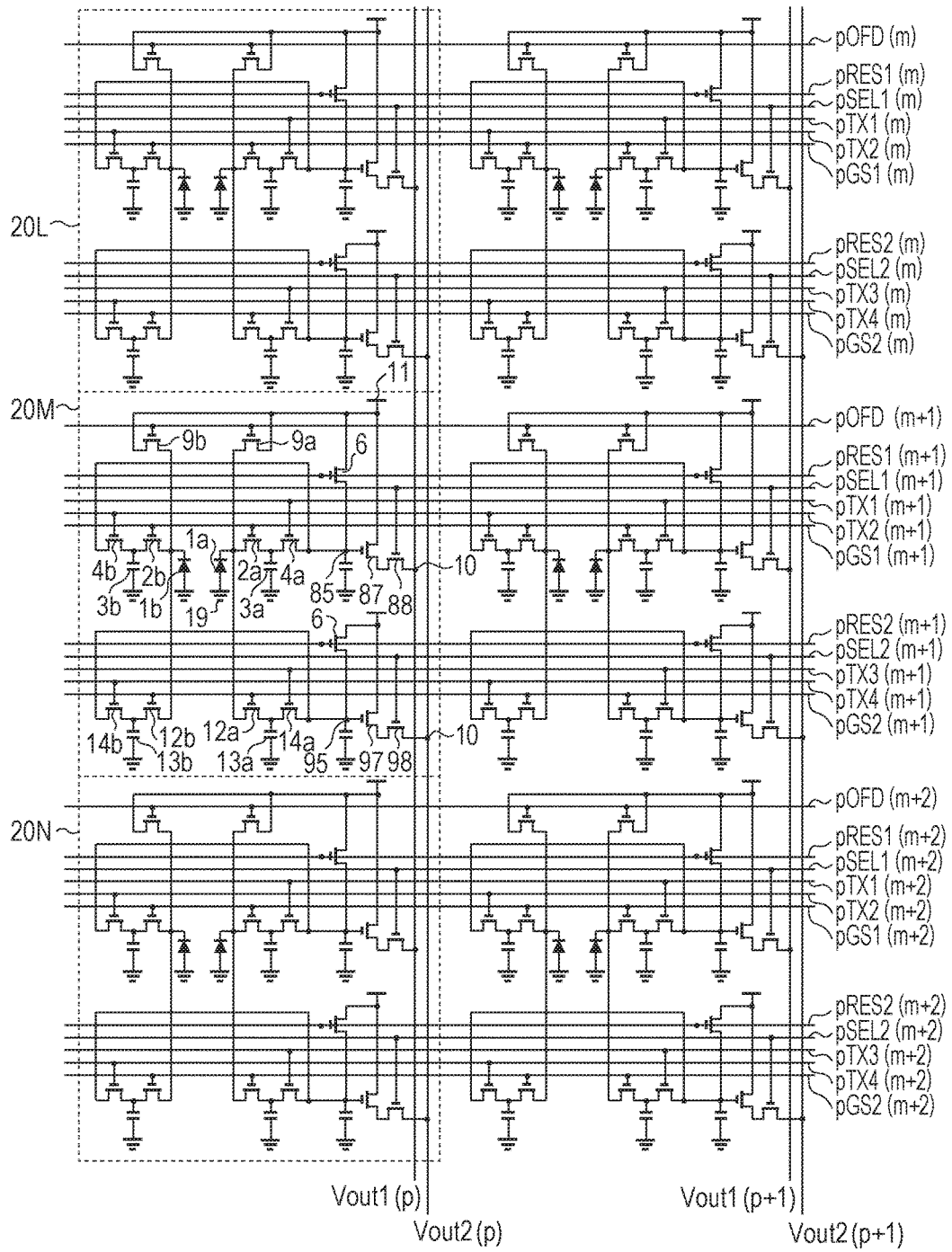
FIG. 11 illustrates the configuration of the unit cell.

FIG. 11 illustrates the configuration of the unit cells 20 of the imaging sensor according to the present exemplary embodiment. The imaging sensor according to the present exemplary embodiment includes unit cells 20L, 20M, and 20N. Each of the unit cells 20L, 20M, and 20N includes a plurality of photodiodes $1a$ and $1b$. Each of the unit cells 20L, 20M, and 20N further includes first transfer switches $2a$ and $2b$. In addition, each of the unit cells 20L, 20M, and 20N includes second transfer switches $4a$ and $4b$. Each of the unit cells 20L, 20M, and 20N also includes third transfer switches $12a$ and $12b$. Each of the unit cells 20L, 20M, and 20N further includes fourth transfer switches $14a$ and $14b$. In addition, each of the unit cells 20L, 20M, and 20N includes first capacitor elements $3a$ and $3b$. In addition, each of the unit cells 20L, 20M, and 20N includes second capacitor elements $13a$ and $13b$. Each of the unit cells 20L, 20M, and 20N also includes an amplification unit 87 including an input node 85 and an amplification unit 97 including an input node 95. Furthermore, in addition, each of the unit cells 20L, 20M, and 20N includes selection switches 88 and 98.

The present exemplary embodiment is different from the imaging sensor according to the first exemplary embodiment in that the single unit cell 20 is provided with two of the sets each including the photoelectric conversion unit, the first transfer unit, the second transfer unit, the third transfer unit, the fourth transfer unit, the first signal holding unit, the second signal holding unit, and the amplification unit.

The signal pGS1($m$) is input to the first transfer switches $2a$ and $2b$ from the vertical scanning circuit 101. The signal pTX(m) is input to the second transfer switches $4a$ and $4b$ from the vertical scanning circuit 101. The signal pGS2($m$) is input to the third transfer switches $12a$ and $12b$ from the vertical scanning circuit 101. The signal pTX2($m$) is input to the fourth transfer switches $14a$ and $14b$ from the vertical scanning circuit 101. The signal pSEL1($m$) is input to the selection switch 88 from the vertical scanning circuit 101. In addition, a signal pSEL2($m$) is input to the selection switch 98 from the vertical scanning circuit 101.

The signals supplied to the respective switches correspond to the respective signals illustrated in FIG. 4 except for the signal pSEL2($m$). With regard to the signal pSEL2($m$), the signal pSEL1($m$+1) described with reference to FIG. 4 may be set as the signal pSEL2($m$).

In the imaging sensor according to the present exemplary embodiment too, the first capacitor elements $3a$ and $3b$ where the first accumulation periods to which the respectively held signals correspond are the same are connected to the common input node 85. In addition, the second capacitor elements $13a$ and $13b$ where the second accumulation periods to which the respectively held signals correspond are the same are connected to the common input node 95.

It should be noted that, with regard to the imaging sensor according to the present exemplary embodiment, the mutual first capacitor elements 3 may be further connected to the common input node in the plurality of unit cells 20. In this case, the mutual second capacitor element 13 may be further connected to the common input node. In this case, as compared with the configuration of FIG. 11, it is possible to further decrease the number of the amplification units and the number of selection switches, and the circuit area in the cell array where the unit cells 20 are arranged can be reduced. This reduction amount of the circuit area can be diverted to the increase in the areas of the photodiode 1, the first capacitor element 3, and the second capacitor element 13. In a case where the area of the photodiode 1 is increased, the sensitivity of the photodiode 1 and the saturating amount of the signal can be increased. In a case where the areas of the first capacitor element 3 and the second capacitor element 13 are increased, the saturating amounts of the respective signals can be increased.

Sixth Exemplary Embodiment

According to the present exemplary embodiment, descriptions will be given with reference to an imaging system provided with the imaging sensor described according to the fifth exemplary embodiment. According to the present exemplary embodiment, a configuration is adopted in which one micro lens is provided for each of the unit cells 20L, 20M, and 20N according to the fifth exemplary embodiment. That is, light enters the photodiodes 1a and 1b of the single unit cell 20 (20L, 20M, 20N) from the single micro lens.

Figure 12:
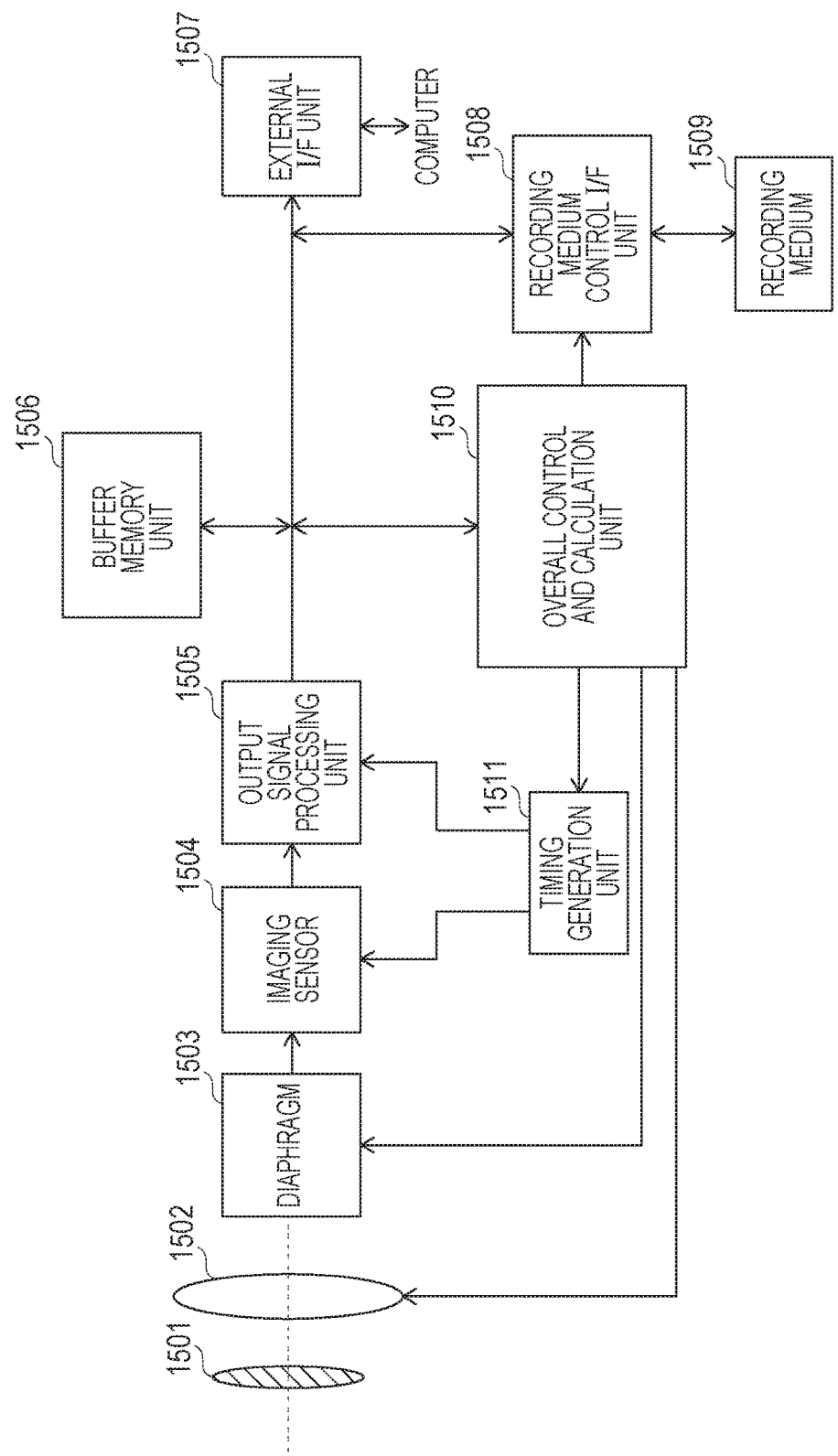
FIG. 12 illustrates a configuration of an imaging system.

A digital still camera, a digital camcorder, a security camera, and the like are used as the imaging system. FIG. 12 is a schematic diagram of a case where the imaging sensor is applied to the digital still camera as an example of the imaging system.

The imaging system exemplified in FIG. 12 includes a barrier 1501 that protects a lens, a lens 1502 that focuses an optical image of an object on an imaging sensor 1504, and a diaphragm 1503 that can vary the amount of light that passes through the lens 1502. The lens 1502 and the diaphragm 1503 are an optical system configured to condense light on the imaging sensor 1504. The imaging system exemplified in FIG. 12 also includes an output signal processing unit 1505 configured to perform processing on an output signal output from the imaging sensor 1504. The output signal processing unit 1505 performs an operation for outputting a signal by performing various corrections and compression when necessary.

The imaging system exemplified in FIG. 12 further includes a buffer memory unit 1506 configured to temporarily store image data and an external interface unit 1507 configured to communicate with an external computer or the like. The imaging system further includes a removable recording medium 1509 such as a semiconductor memory configured to perform recording or readout of imaging data and a recording medium control interface unit 1508 configured to perform recording or readout with respect to the recording medium 1509. The imaging system further includes an overall control calculation unit 1510 configured to perform various calculations and control the entirety of the digital still camera and a timing supply unit 1511 configured to output various timing signals to the imaging sensor 1504 and the output signal processing unit 1505. Herein, the timing signals and the like may be input from the outside, and it is sufficient when the imaging system includes at least the imaging sensor 1504 and the output signal processing unit 1505 configured to process the output signal output from the imaging sensor 1504.

The output signal processing unit 1505 is provided on a second semiconductor substrate that is different from a first semiconductor substrate on which the imaging sensor 1504 is formed. The first semiconductor substrate and the second semiconductor substrate may be respectively separate chips or may be a single chip by laminating the first semiconductor substrate and the second semiconductor substrate.

The output signal processing unit 1505 configured to process the output signal output from the imaging sensor can detect the de-focusing amount of a phase difference detection method by using the signal corresponding to the signals accumulated by the photodiode 1a and the signal corresponding to the signals accumulated by the photodiode 1b.

The overall control calculation unit 1510 can perform an operation for driving the optical system to adjust the focus on the object by using the detected de-focusing amount.

It should be noted that, according to the present exemplary embodiment, the descriptions have been given while the unit cell 20 included in the imaging sensor is provided with the two photodiodes 1a and 1b. As another example, the unit cells 20 may include still more photodiodes. That is, the single unit cell 20 may be provided with three or more of the sets each including the photoelectric conversion unit, the first transfer unit, the second transfer unit, the third transfer unit, the fourth transfer unit, the first signal holding unit, the second signal holding unit, and the amplification unit. For example, the single unit cell 20 may be provided with four sets. In this case, the four photodiode 1 are arranged in a plurality of rows and a plurality of columns with respect to the single micro lens. In this case, the phase differences in a plurality of directions can be detected, so that it is possible to more accurately adjust the focus with respect to the object.

As described above, the imaging system according to the present exemplary embodiment can perform the imaging operation by applying the imaging sensor 1504 to the imaging system.

It should be noted that this exemplary embodiment has been described as the imaging system provided with the imaging sensor according to the fifth exemplary embodiment, but the imaging sensors according to the respective first to fourth exemplary embodiments can be applied as the imaging sensor.

Seventh Exemplary Embodiment

Figure 13A:
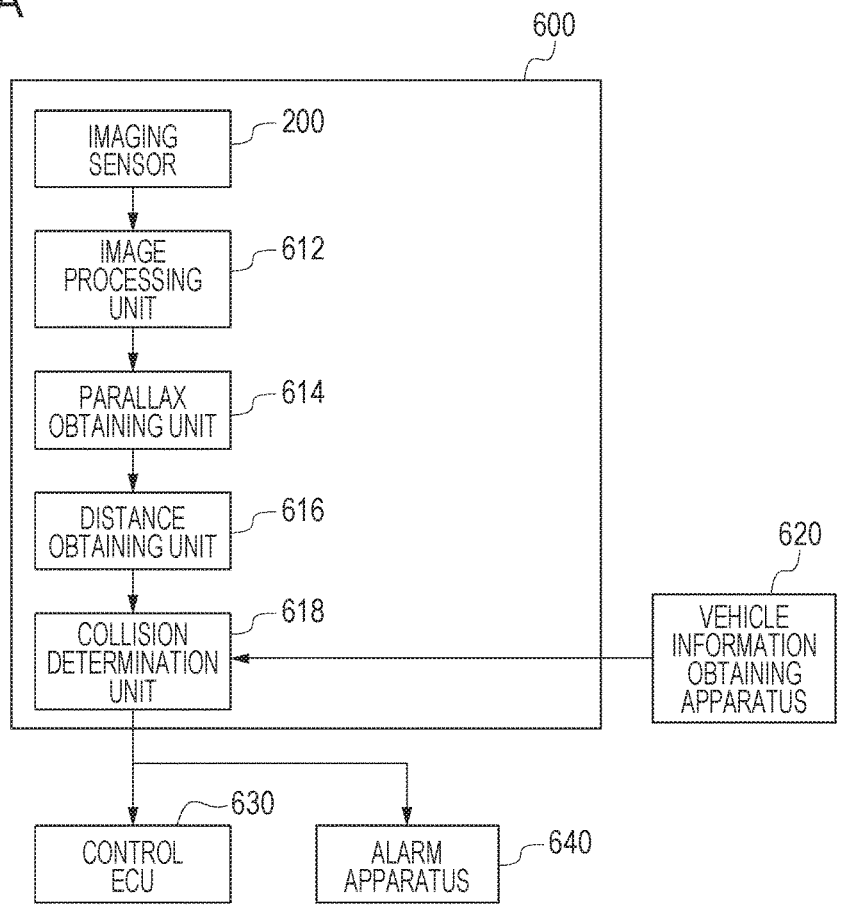
FIGS. 13A and 13B illustrate the configuration of the imaging system.
Figure 13B:
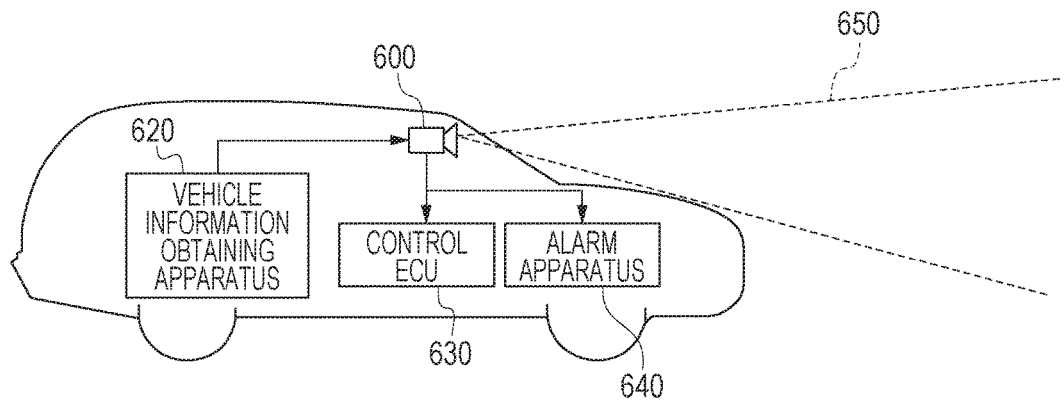

FIGS. 13A and 13B illustrate configurations of an imaging system 600 and a moving body according to the present exemplary embodiment. FIG. 13A illustrates an example of the imaging system 600 related to an in-vehicle camera. The imaging system 600 includes a solid-state imaging sensor 200. The solid-state imaging sensor 200 is one of the imaging sensors according to the respective exemplary embodiments described above. The imaging system 600 includes an image processing unit 612 configured to perform image processing on plural pieces of image data obtained by the solid-state imaging sensor 200 and a parallax obtaining unit 614 configured to calculate a parallax (phase difference of the parallax images) on the basis of the plural pieces of image data obtained by the imaging system 600. The imaging system 600 also includes a distance obtaining unit 616 configured to calculate a distance to a target object on the basis of the calculated parallax and a collision determination unit 618 configured to determine whether or not a collision probability exists on the basis of the calculated distance. Herein, the parallax obtaining unit 614 and the distance obtaining unit 616 are examples of a distance information obtaining unit configured to obtain distance information to the target object. That is, the distance information refers to information on the parallax, the de-focusing amount, the distance to the target object, or the like. The collision determination unit 618 may determine the collision probability by using any of these pieces of distance information. The distance information obtaining unit may be realized by dedicatedly designed hardware or may also be realized by software module. In addition, the distance information obtaining unit may be realized by a field programmable gate array (FPGA), an application specific integrated circuit (ASIC), or the like or may also be realized by any combination of these elements.

The imaging system 600 is connected to a vehicle information obtaining apparatus 620 and can obtain vehicle information such as a vehicle speed, a yaw rate, or a rudder angle. A control electrical control unit (ECU) 630 corresponding to a control apparatus configured to output a control signal for generating braking force to the vehicle on the basis of the determination result in the collision determination unit 618 is also connected to the imaging system 600. That is, the control ECU 630 is an example of a moving body control unit configured to control the moving body on the basis of distance information. An alarm apparatus 640 configured to issue a warning to a driver on the basis of the determination result in the collision determination unit 618 is also connected to the imaging system 600. For example, in a case where the collision probability is high as the determination result in the collision determination unit 618, the control ECU 630 performs vehicle control to avoid a collision or alleviate a damage by applying a brake, releasing an accelerator, suppressing an engine output, or the like. The alarm apparatus 640 issues a warning to a user by sounding an alarm such as sound, displaying warning information on a screen such as a car navigation system, vibrating a seat belt or steering, or the like.

According to the present exemplary embodiment, a surrounding of the vehicle such as, for example, a forward area or a backward area is imaged by the imaging system 600. FIG. 13B illustrates the imaging system 600 in a case where the forward area (imaging range 650) of the vehicle is imaged. The vehicle information obtaining apparatus 620 transmits an instruction such that the imaging system 600 is operated to execute the imaging. When the imaging sensor according to the respective exemplary embodiments described above is used as the solid-state imaging sensor 200, the imaging system 600 according to the present exemplary embodiment can improve the accuracy of the focusing.

In the above explanations, the example of the control for avoiding the collision with the other vehicle has been described, but the present exemplary embodiment can also be applied to control for following the other vehicle to perform automated driving, control for the automated driving without drifting from a lane, or the like. Furthermore, the imaging system can be applied to not only the vehicle such as an automobile but also a moving body (moving apparatus) such as, for example, a vessel, aircraft, or industrial robot. In addition, the imaging system can be widely applied to not only the moving body but also a device using object recognition such as an intelligent transport system (ITS).

It should be noted that the above-described exemplary embodiments are all merely specific examples for carrying out the disclosure, and the technical scope of the disclosure is not to be construed to a limited extent by these exemplary embodiments. That is, the disclosure can be carried out in various forms without departing from the technical concept or the main features. In addition, the disclosure can be carried out by combining the above-described respective exemplary embodiments in various manners.

According to the exemplary embodiments of the disclosure, it is possible to reduce the circuit area of the pixels provided with the plurality of signal holding units.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-112840 filed Jun. 6, 2016, which is hereby incorporated by reference herein in its entirety.

What is claimed is:

1. An imaging sensor comprising:
a plurality of sets, each set including a photoelectric conversion unit, a first signal holding unit, an amplification unit provided with an input node, a first transfer unit provided in an electric path between the photoelectric conversion unit and the first signal holding unit, a second transfer unit, a second signal holding unit, a third transfer unit provided in an electric path between the photoelectric conversion unit and the second signal holding unit, and a fourth transfer unit; and
a control unit configured to control the plurality of sets,
wherein the control unit sets starting and ending of transfer of a signal by the first transfer unit from the photoelectric conversion unit to the first signal holding unit to be respectively performed at a same time in the plurality of sets,
wherein the photoelectric conversion unit accumulates signals respectively in a first accumulation period and a second accumulation period, one of the first accumulation period and the second accumulation period including a period not overlapping the other of the first accumulation period and the second accumulation period,
wherein the respective first transfer units of the plurality of sets transfer the signals corresponding to the first accumulation period from the photoelectric conversion unit to the first signal holding unit,
wherein the respective third transfer units of the plurality of sets transfer the signals corresponding to the second accumulation period from the photoelectric conversion unit to the second signal holding unit,
wherein the respective first signal holding units of the plurality of sets are commonly connected to the input node of one set via the second transfer unit of the set to which the first signal holding unit corresponds, and
wherein the respective second signal holding units of the plurality of sets are commonly connected to the input node of one set via the fourth transfer unit of the set to which the second signal holding unit corresponds.

2. The imaging sensor according to claim 1, wherein a length of the second accumulation period is longer than a length of the first accumulation period.

3. The imaging sensor according to claim 1, wherein a length of the first accumulation period is equal to a length of the second accumulation period.

4. The imaging sensor according to claim 2, wherein one frame period includes a plurality of the first accumulation periods and a plurality of the second accumulation periods.

5. The imaging sensor according to claim 3, wherein one frame period includes a plurality of the first accumulation periods and a plurality of the second accumulation periods.

6. The imaging sensor according to claim 4,
wherein the first signal holding unit of a first set among the plurality of sets is connected to the input node of the first set via the second transfer unit of the first set,
wherein the first signal holding unit of a second set among the plurality of sets is connected to the input node of the first set via the second transfer unit of the second set,
wherein the second signal holding unit of the first set is connected to the input node of the second set via the fourth transfer unit of the first set, and wherein the second signal holding unit of the second set is connected to the input node of the second set via the fourth transfer unit of the second set.

7. The imaging sensor according to claim 5,
wherein the first signal holding unit of a first set among the plurality of sets is connected to the input node of the first set via the second transfer unit of the first set,
wherein the first signal holding unit of a second set among the plurality of sets is connected to the input node of the first set via the second transfer unit of the second set,
wherein the second signal holding unit of the first set is connected to the input node of the second set via the fourth transfer unit of the first set, and
wherein the second signal holding unit of the second set is connected to the input node of the second set via the fourth transfer unit of the second set.

8. The imaging sensor according to claim 6,
wherein the first amplification unit of the first set outputs the signal to a first signal line, and
wherein the second amplification unit of the second set outputs the signal to a second signal line.

9. The imaging sensor according to claim 7,
wherein the first amplification unit of the first set outputs the signal to a first signal line, and
wherein the second amplification unit of the second set outputs the signal to a second signal line.

10. The imaging sensor according to claim 4,
wherein the first signal holding unit of a first set among the plurality of sets is connected to the input node of the first set via the second transfer unit of the first set,
wherein the first signal holding unit of a second set among the plurality of sets is connected to the input node of the first set via the second transfer unit of the second set,
wherein the second signal holding unit of the first set is connected to the input node of a third set among the plurality of sets via the fourth transfer unit of the first set,
wherein the second signal holding unit of the third set is connected to the input node of the first set via the fourth transfer unit of the third set, and
wherein the second set, the first set, and the third set are arranged in a stated order without an intermediation of other sets therebetween.

11. The imaging sensor according to claim 5,
wherein the first signal holding unit of a first set among the plurality of sets is connected to the input node of the first set via the second transfer unit of the first set,
wherein the first signal holding unit of a second set among the plurality of sets is connected to the input node of the first set via the second transfer unit of the second set,
wherein the second signal holding unit of the first set is connected to the input node of a third set among the plurality of sets via the fourth transfer unit of the first set,
wherein the second signal holding unit of the third set is connected to the input node of the first set via the fourth transfer unit of the third set, and
wherein the second set, the first set, and the third set are arranged in a stated order without an intermediation of other sets therebetween.

12. The imaging sensor according to claim 7,
wherein the second transfer unit of the first set and the second transfer unit of the second set are connected to the same signal line with respect to the control unit, and
wherein the fourth transfer unit of the first set and the fourth transfer unit of the third set are connected to the same signal line with respect to the control unit.

13. The imaging sensor according to claim 1, further comprising:
a plurality of unit cells arranged in rows and columns; and
a plurality of micro lens,
wherein each of the plurality of unit cells includes one micro lens and one of the plurality of sets.

14. The imaging sensor according to claim 1, further comprising:
a plurality of unit cells arranged in rows and columns; and
a plurality of micro lens,
wherein each of the plurality of unit cells includes one micro lens and the plurality of sets.

15. An imaging system comprising:
an imaging sensor; and
a signal processing unit configured to generate an image by processing a signal output by the imaging sensor,
wherein the imaging sensor includes
a plurality of sets, each set including a photoelectric conversion unit, a first signal holding unit, an amplification unit provided with an input node, a first transfer unit provided in an electric path between the photoelectric conversion unit and the first signal holding unit, a second transfer unit, a second signal holding unit, a third transfer unit provided in an electric path between the photoelectric conversion unit and the second signal holding unit, and a fourth transfer unit, and
a control unit configured to control the plurality of sets,
wherein the control unit sets starting and ending of transfer of a signal by the first transfer unit from the photoelectric conversion unit to the first signal holding unit to be respectively performed at a same time in the plurality of sets,
wherein the photoelectric conversion unit accumulates signals respectively in a first accumulation period and a second accumulation period, one of the first accumulation period and the second accumulation period including a period not overlapping the other of the first accumulation period and the second accumulation period,
wherein the respective first transfer units of the plurality of sets transfer the signals corresponding to the first accumulation period from the photoelectric conversion unit to the first signal holding unit,
wherein the respective third transfer units of the plurality of sets transfer the signals corresponding to the second accumulation period from the photoelectric conversion unit to the second signal holding unit,
wherein the respective first signal holding units of the plurality of sets are commonly connected to the input node of one set via the second transfer unit of the set to which the first signal holding unit corresponds, and
wherein the respective second signal holding units of the plurality of sets are commonly connected to the input node of one set via the fourth transfer unit of the set to which the second signal holding unit corresponds.

16. An imaging system comprising:
an imaging sensor; and
a signal processing unit configured to process a signal output by the imaging sensor,
wherein the imaging sensor includes
a plurality of sets, each set including a photoelectric conversion unit, a first signal holding unit, an amplification unit provided with an input node, a first transfer unit provided in an electric path between the photoelectric conversion unit and the first signal holding unit, a second transfer unit, a second signal holding unit, a third transfer unit provided in an electric path between the photoelectric conversion unit and the second signal holding unit, and a fourth transfer unit, a control unit configured to control the plurality of sets, a plurality of unit cells arranged in rows and columns, and a plurality of micro lens, wherein the control unit sets starting and ending of transfer of a signal by the first transfer unit from the photoelectric conversion unit to the first signal holding unit to be respectively performed at a same time in the plurality of sets, wherein the photoelectric conversion unit accumulates signals respectively in a first accumulation period and a second accumulation period, one of the first accumulation period and the second accumulation period including a period not overlapping the other of the first accumulation period and the second accumulation period, wherein the respective first transfer units of the plurality of sets transfer the signals corresponding to the first accumulation period from the photoelectric conversion unit to the first signal holding unit, wherein the respective third transfer units of the plurality of sets transfer the signals corresponding to the second accumulation period from the photoelectric conversion unit to the second signal holding unit, wherein the respective first signal holding units of the plurality of sets are commonly connected to the input node of one set via the second transfer unit of the set to which the first signal holding unit corresponds, wherein the respective second signal holding units of the plurality of sets are commonly connected to the input node of one set via the fourth transfer unit of the set to which the second signal holding unit corresponds, wherein each of the plurality of unit cells includes one micro lens and the plurality of sets, and wherein the signal processing unit detects a de-focusing amount by using a signal corresponding to a signal of the photoelectric conversion unit of one of the plurality of sets in one unit cell and a signal corresponding to a signal of the photoelectric conversion unit of the other one of the plurality of sets in the one unit cell.

17. A moving body comprising:

an imaging sensor;

a distance information obtaining unit configured to obtain distance information from a parallax image based on a signal from the imaging sensor to an object; and a moving body control unit configured to control the moving body on a basis of the distance information, wherein the imaging sensor includes a plurality of sets, each set including a photoelectric conversion unit, a first signal holding unit, an amplification unit provided with an input node, a first transfer unit provided in an electric path between the photoelectric conversion unit and the first signal holding unit, a second transfer unit, a second signal holding unit, a third transfer unit provided in an electric path between the photoelectric conversion unit and the second signal holding unit, and a fourth transfer unit; and a control unit configured to control the plurality of sets, wherein the control unit sets starting and ending of transfer of a signal by the first transfer unit from the photoelectric conversion unit to the first signal holding unit to be respectively performed at a same time in the plurality of sets, wherein the photoelectric conversion unit accumulates signals respectively in a first accumulation period and a second accumulation period, one of the first accumulation period and the second accumulation period including a period not overlapping the other of the first accumulation period and the second accumulation period, wherein the respective first transfer units of the plurality of sets transfer the signals corresponding to the first accumulation period from the photoelectric conversion unit to the first signal holding unit, wherein the respective third transfer units of the plurality of sets transfer the signals corresponding to the second accumulation period from the photoelectric conversion unit to the second signal holding unit, wherein the respective first signal holding units of the plurality of sets are commonly connected to the input node of one set via the second transfer unit of the set to which the first signal holding unit corresponds, and wherein the respective second signal holding units of the plurality of sets are commonly connected to the input node of one set via the fourth transfer unit of the set to which the second signal holding unit corresponds.

18. The moving body according to claim 17, wherein a length of the second accumulation period is longer than a length of the first accumulation period.

19. The moving body according to claim 17, wherein a length of the first accumulation period is equal to a length of the second accumulation period.

20. The moving body according to claim 17, wherein the imaging sensor further includes a plurality of unit cells arranged in rows and columns, and a plurality of micro lens, wherein each of the plurality of unit cells includes one micro lens and one of the plurality of sets.

* * * * *